(12) United States Patent
Chuang et al.

(10) Patent No.: US 11,749,617 B2
(45) Date of Patent: Sep. 5, 2023

(54) PACKAGE STRUCTURE AND METHOD FOR FABRICATING THE SAME

(71) Applicant: TAIWAN SEMICONDUCTOR MANUFACTURING COMPANY LTD., Hsinchu (TW)

(72) Inventors: Harry-Hak-Lay Chuang, Hsinchu County (TW); Chia-Hsiang Chen, Hsinchu (TW); Meng-Chun Shih, Hsinchu (TW); Ching-Huang Wang, Taoyuan County (TW); Tien-Wei Chiang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/854,022

(22) Filed: Jun. 30, 2022

(65) Prior Publication Data

US 2022/0328423 A1 Oct. 13, 2022

Related U.S. Application Data

(63) Continuation of application No. 17/079,325, filed on Oct. 23, 2020, now Pat. No. 11,380,626, which is a
(Continued)

(51) Int. Cl.
*H01L 23/552* (2006.01)
*H01L 23/00* (2006.01)
(Continued)

(52) U.S. Cl.
CPC ............ *H01L 23/552* (2013.01); *H01L 21/56* (2013.01); *H01L 23/3107* (2013.01);
(Continued)

(58) Field of Classification Search
CPC .............. H01L 23/552; H01L 23/3107; H01L 23/4952; H01L 21/56; H01L 24/48; H01L 24/85; H01L 2224/48245; H01L 2224/85035; H01L 2224/85203; H01L 2224/85205
(Continued)

(56) References Cited

U.S. PATENT DOCUMENTS

2012/0309131 A1* 12/2012 Bando .................... H01L 24/32
438/126

\* cited by examiner

*Primary Examiner* — Igwe U Anya
(74) *Attorney, Agent, or Firm* — WPAT LAW; Anthony King

(57) ABSTRACT

The present disclosure provides a package structure, including a mounting pad having a mounting surface, a semiconductor chip disposed on the mounting surface of the mounting pad, wherein the semiconductor chip includes a first surface, a second surface opposite to the first surface and facing the mounting surface, and a third surface connecting the first surface and the second surface, a first magnetic field shielding, including a first portion proximal to the third surface of the semiconductor chip, wherein the first portion has a first height calculated from the mounting surface to a top surface, and a second portion distal to the semiconductor chip, has a second height calculated from the mounting surface to a position at a surface facing away from the mounting surface, wherein the second height is less than the first height, wherein the second portion has an inclined sidewall.

20 Claims, 26 Drawing Sheets

Related U.S. Application Data continuation of application No. 16/034,865, filed on Jul. 13, 2018, now Pat. No. 10,818,609.

(51) Int. Cl.
*H01L 23/31* (2006.01)
*H01L 23/495* (2006.01)
*H01L 21/56* (2006.01)

(52) U.S. Cl.
CPC .......... *H01L 23/4952* (2013.01); *H01L 24/48* (2013.01); *H01L 24/85* (2013.01); *H01L 2224/48245* (2013.01); *H01L 2224/85035* (2013.01); *H01L 2224/85203* (2013.01); *H01L 2224/85205* (2013.01)

(58) Field of Classification Search
USPC ........................................................ 257/659
See application file for complete search history.

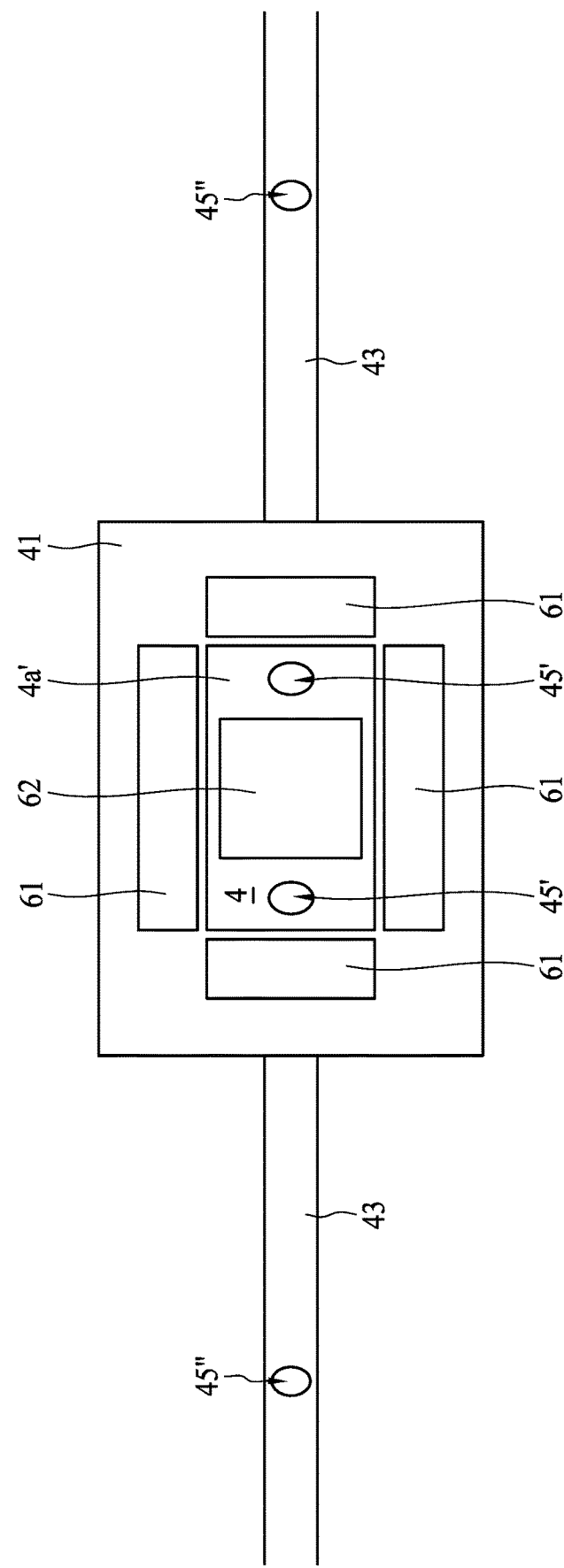

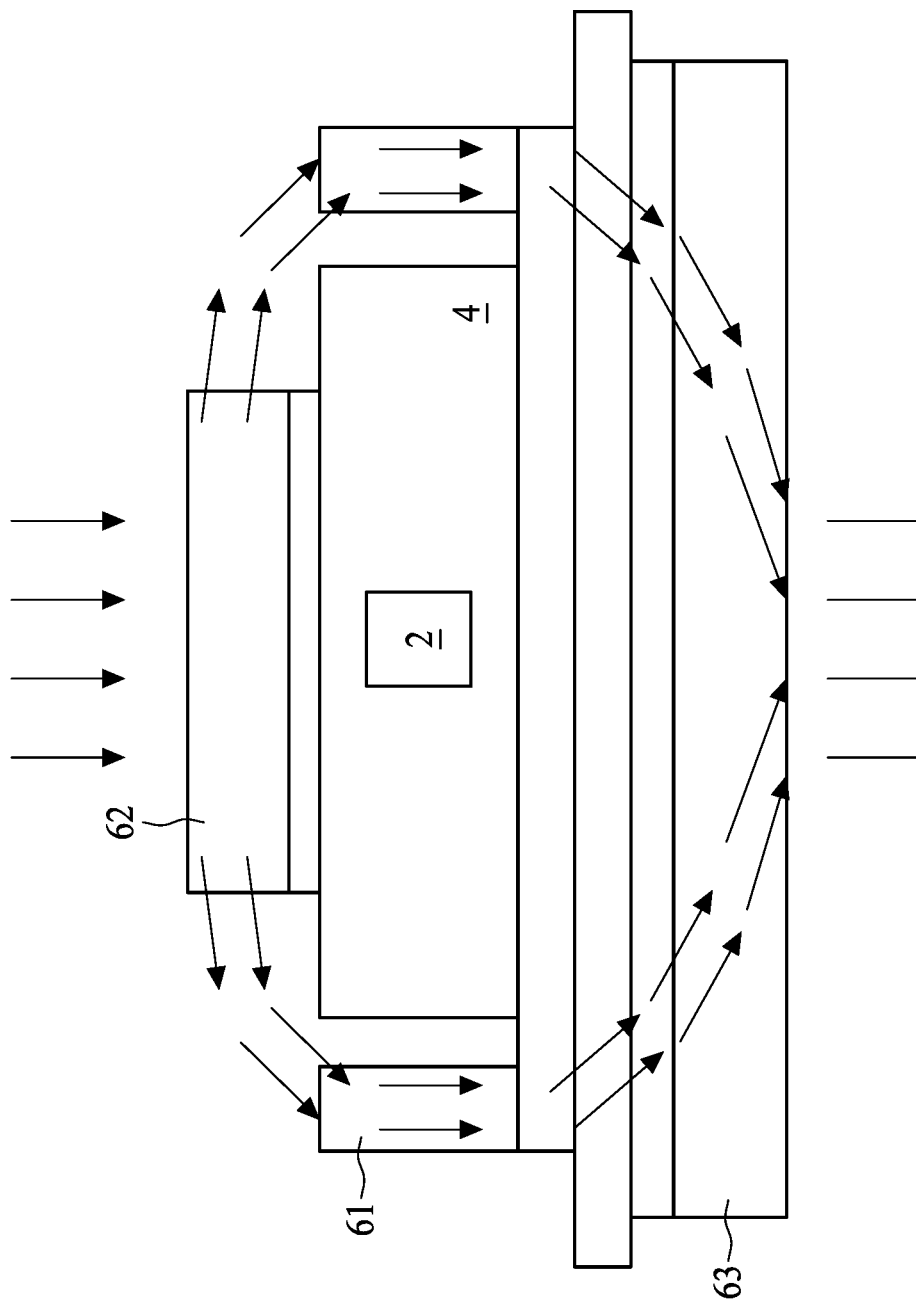

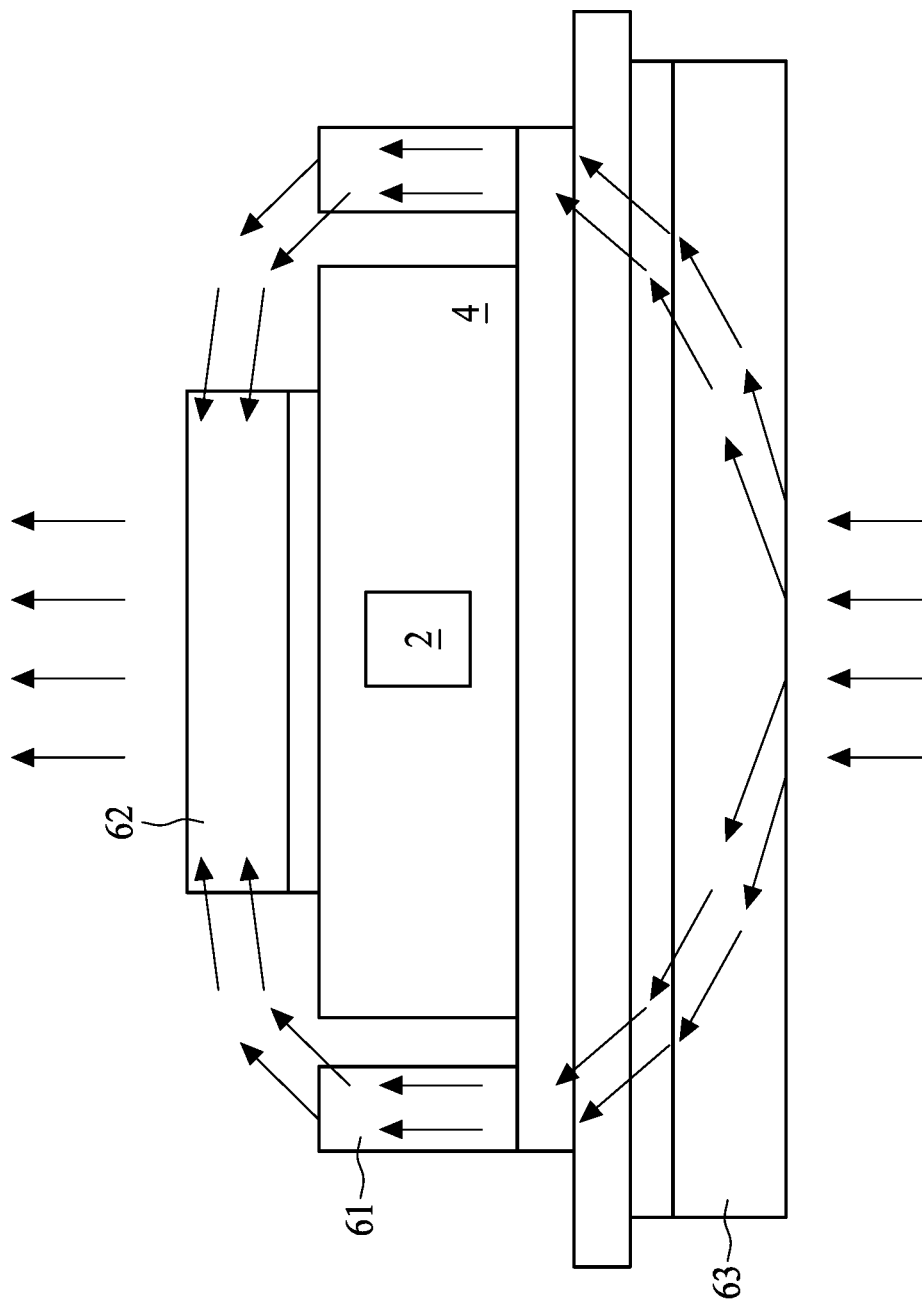

PACKAGE STRUCTURE AND METHOD FOR FABRICATING THE SAME

CROSS REFERENCE TO RELATED APPLICATIONS

This application is a continuation application of U.S. application Ser. No. 17/079,325, filed Oct. 23, 2020, which claims the benefit of U.S. Pat. No. 10,818,609, filed on Jul. 13, 2018, under 35 U.S.C. 120.

BACKGROUND

Magnetic devices are widely used semiconductor devices for electronic applications, including radios, televisions, cell phones, and personal computing devices. One type of well-known magnetic devices is the semiconductor storage device, such as magnetic random access memories (MRAMs).

Some of the recent development pertinent to magnetic devices such as MRAMs involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MU) device.

MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer. Pinned layer has a fixed magnetization direction. When current flows in the direction from free layer to pinned layer, electrons flow in a reverse direction, that is, from pinned layer to free layer. The electrons are polarized to the same magnetization direction of pinned layer after passing pinned layer; flowing through tunnel layer; and then into and accumulating in free layer. Eventually, the magnetization of free layer is parallel to that of pinned layer, and MTJ device will be at a low resistance state. The electron injection caused by current is referred to as a major injection.

When current flowing from pinned layer to free layer is applied, electrons flow in the direction from free layer to pinned layer. The electrons having the same polarization as the magnetization direction of pinned layer are able to flow through tunnel layer and into pinned layer. Conversely, electrons with polarization differing from the magnetization of pinned layer will be reflected (blocked) by pinned layer and will accumulate in free layer. Eventually, magnetization of free layer becomes anti-parallel to that of pinned layer, and MTJ device will be at a high resistance state. The respective electron injection caused by current is referred to as a minor injection.

The state-switching of the aforementioned exemplary magnetic devices may be controlled by applying magnetic fields created by electric current. However, the magnetic devices are easily interfered by external magnetic field. External magnetic field can have significant effect on magnetization and/or the polarity of free layers and/or pinned layers, further inducing anomalous memory storage, aberrant device operations, malfunctioning or damages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5B is a schematic diagrams illustrating package structures under an external magnetic field from a top view, in accordance with some embodiments of the present disclosure.

FIG. 5C to FIG. 5E are top views of package structures, in accordance with some embodiments of the present disclosure.

FIG. 6B' to FIG. 6B" are schematic diagrams illustrating package structures under an external magnetic field from cross-sectional views, in accordance with some embodiments of the present disclosure.

DETAILED DESCRIPTION

Figure 1:
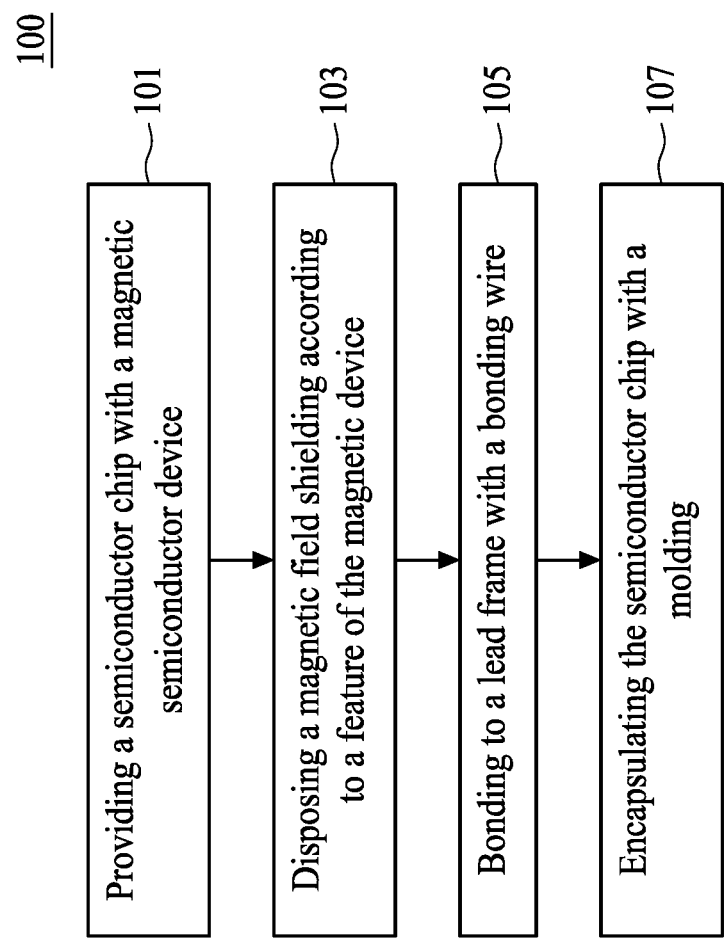
FIG. 1 is a flow chart representing methods for fabricating a package structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Some of the magnetic devices, for example, magnetic random access memories (MRAMs), utilize magnetic polarity for operation. The use of magnetic polarity helps mitigating the problems of volatility of memory storage because it does not entail electrical current to retain data. However, some of the magnetic devices are sensitive to external magnetic field. External magnetic field may significantly changes magnetization and/or the polarity, further inducing anomalies. Present disclosure provides a package structure having one or more magnetic field shieldings in order to help mitigating the aforesaid issues.

Figure 2A:
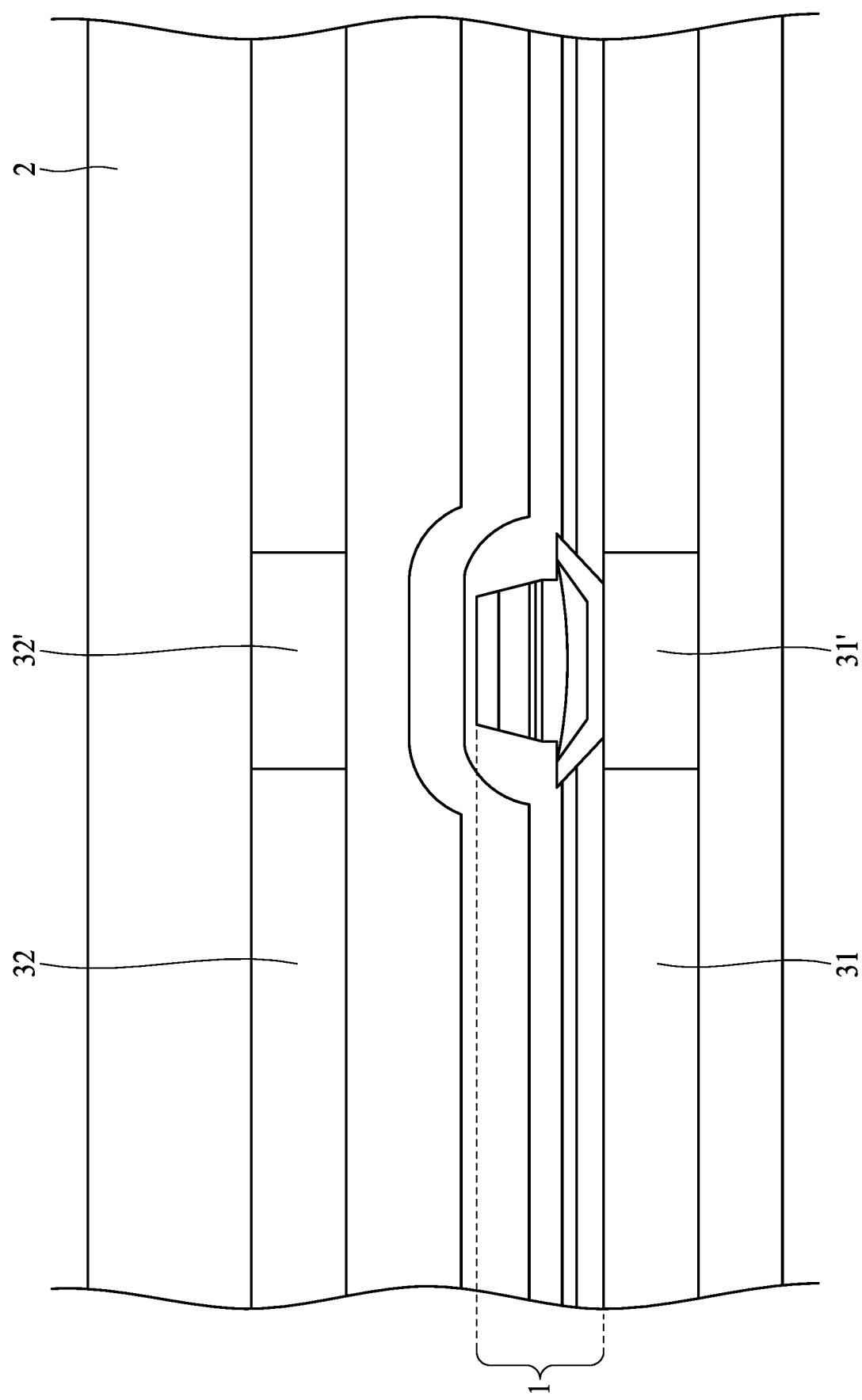
FIG. 2A is a partially enlarged view of a cross section of a magnetic device, in accordance with some embodiments of the present disclosure.

Referring to FIG. 1 and FIG. 2A, FIG. 1 is a flow chart representing methods for fabricating a package structure, and FIG. 2A is a cross section of a magnetic semiconductor structure, in accordance with some embodiments of the present disclosure. In operation 101, a magnetic device 2 is provided, wherein the magnetic device 2 can be devices that are sensitive to magnetic field or entailing operations involving magnetization and/or magnetic polarity, for example, MRAMs, magnetic memory storages, magnetic components, or the like. For an exemplary demonstration, MRAM is used as example as a magnetic component 1 in the magnetic device 2 herein, but the disclosure is not limited thereto. In some embodiments, the magnetic component 1 includes magnetic tunneling junction (MTJ), electrodes, free layer, tunnel layer, pinned layer, or the like. In some embodiments, the magnetic component 1 is disposed between an $N^{th}$ metal line 31' and an $(N+1)^{th}$ metal line 32', wherein the $N^{th}$ metal line 31' is disposed in an $N^{th}$ metal layer 31, and the $(N+1)^{th}$ metal line 32' is disposed in an $(N+)^{h}$ metal layer 32. In some embodiments, a plurality of magnetic components 1 are included in the magnetic device 2. In some embodiments, the plurality of magnetic components 1 can be disposed as an array in the magnetic device 2. In some embodiments, the plurality of magnetic components 1 can be arranged in stacks in the magnetic device 2.

Figure 2B:
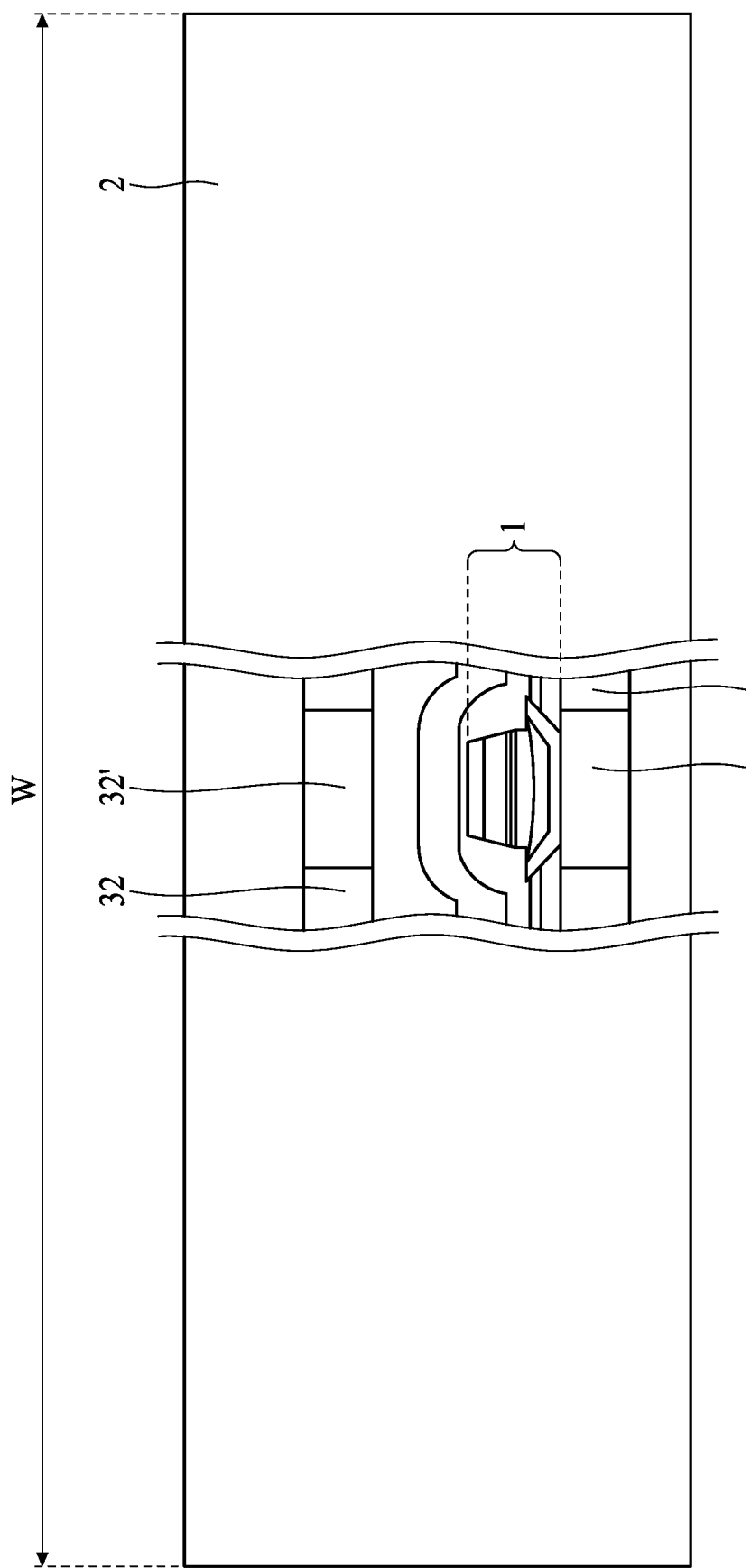
FIG. 2B is a cross section of a magnetic device, in accordance with some embodiments of the present disclosure.

Referring to FIG. 1 and FIG. 2B, FIG. 2B is a partially enlarged view of a cross section of the magnetic device 2, in accordance with some embodiments of the present disclosure. A feature of the magnetic device 2 may be furtherly provided in operation 101. For example, a width W of the magnetic device 2 is provided. The $N^{th}$ metal line 31' and the $(N+1)^{th}$ metal line 32' are disposed in the magnetic device 2. The semiconductor device 2 may further include vias, pads, connectors, dielectric layers, and/or other semiconductor structures.

Figure 3:
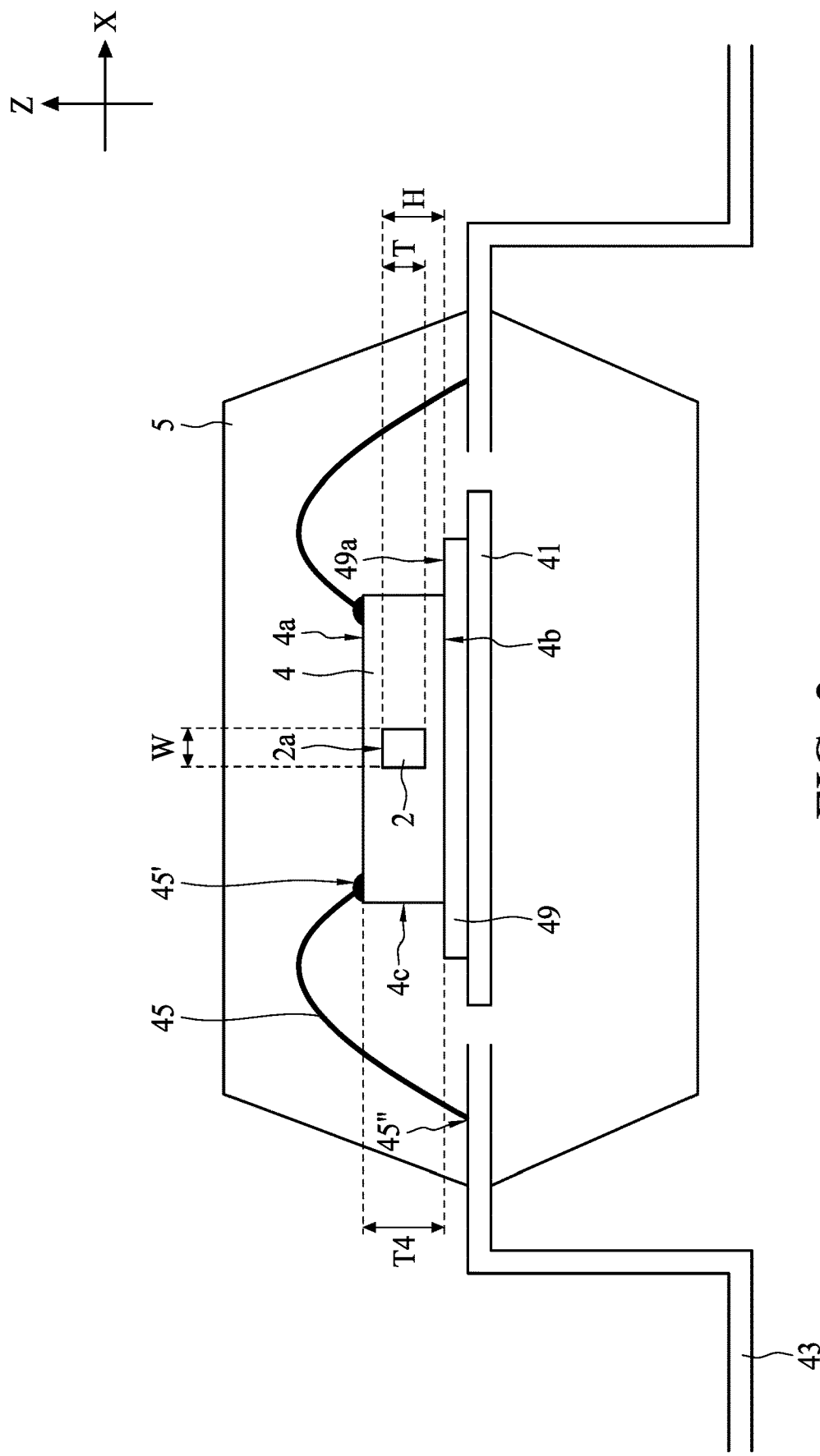
FIG. 3 is a cross section of package structures, in accordance with some embodiments of the present disclosure.

Referring to 1 and FIG. 3, FIG. 3 is a cross section of a package structure, in accordance with some embodiments of the present disclosure. The magnetic device 2 can be disposed in, integrated in, or disposed on a semiconductor chip 4. In some embodiments, the semiconductor chip 4 can be an integrated chip, or a semiconductor chip. A thickness direction of the semiconductor chip 4 is taken as a thickness direction z hereinafter, as a direction x is perpendicular to the thickness direction z. The semiconductor chip 4 has a first surface 4a perpendicular to the thickness direction z, a second surface 4b opposite to the first surface 1a, and a third surface 4c connecting the first surface 1a and the second surface 4b. In some embodiments, the third surface 4c is parallel to the thickness direction z. In some embodiments, the third surface 4c includes four faces. The semiconductor chip 4 is disposed above a lead frame pad 41 with the second surface 4b facing the lead frame pad 41. In some embodiments, the semiconductor chip 4 is attached to the lead frame pad 41 on the second surface 2b by an adhesive layer 49. In some embodiments, a portion of a mounting surface 49a of the adhesive layer 49 is exposed from the semiconductor chip 4, and a portion of the lead frame pad 41 is exposed from the adhesive layer 49. In the present disclosure, the definition of a height H is the distant measured from an uppermost surface 2a of the magnetic semiconductor structure 2 to the mounting surface 49a. In operation 101, the height H is provided. In some embodiments, a thickness T of the magnetic device 2 is further provided. Since the magnetic device 2 may be disposed above the mounting surface 49a, the height Il is greater than or equal to the thickness T. In some of the embodiments, the height H may be equal to a thickness T4 of the semiconductor chip 4. In operation 103, at least a magnetic field shielding is disposed based on at least a criterion pertinent to at least a feature of the magnetic device 2. The details of the operation 103 will be subsequently discussed in FIG. 4A to FIG. 6G.

In operation 105, a bonding wire 45 electrically connects between the semiconductor chip 4 and a lead frame 43. In some embodiments, the operation 105 is performed subsequent to the operation 103. While in some other embodiments, the operation 105 may be performed prior to the operation 103. The bonding wire 45 is connected to the semiconductor chip 4 through a first bonding surface 45', wherein the first bonding surface 45' is a portion of the first surface 4a. For exemplary demonstration, ball bonding is one of the methods for attaching the bonding wire 45 to the semiconductor chip 4 through the first bonding surface 45'. The bonding wire 45 can be fed by a capillary, and a combination of heat, pressure, and/or ultrasonic energy can be used to make a weld at the end of the bonding wire 45. For example, a bonding ball is formed at the tip of the capillary, and a combination of heat, pressure, and/or ultrasonic energy may form a weld between the bonding ball and the first bonding surface 45'. The capillary may be subsequently moved to a second bonding surface 45" on the lead frame 43. A combination of ultrasonic vibration, pressure, and/or heat may be applied to crush the bonding wire 45 on the second bonding surface 45", which is known as tail bond or second bond. In some embodiments, if a magnetic field shielding (not shown in FIG. 3) is disposed between the first bonding surface 45' and the second bonding surface 45" in operation 103, the capillary may be moved beyond and across the magnetic field shielding, as the bonding wire 45 may be in a state of crossing over the magnetic field shielding. The details of the disposal of the magnetic field shielding between the first bonding surface 45' and the second bonding surface 45" will be subsequently discussed in FIG. 5A to FIG. 5G. However, the method of wire bonding in operation 105 in the disclosure is not limited thereto; any suitable methods for wire bonding are also under consideration.

In operation 107, the semiconductor chip 4 including the magnetic device 2, the bonding wire 45, the lead frame pad 41, and the adhesive layer 49 are encapsulated by a molding 5. In some embodiments, the molding 5 further surrounds at least a portion of the lead frame 43. The lead frame 43 protrudes from the molding 5, and may be electrically connected to external circuitries. The molding 5 may include polymers such as plastic compounds, epoxy, or the like, but the disclosure is not limited thereto. The molding 5 may mitigate defects from outside and enhance the mechanical strength of the package structure. However, the molding 5 may not effectively alleviate the affection of external magnetic field on the magnetic device 2, further inducing malfunction.

Figure 4A:
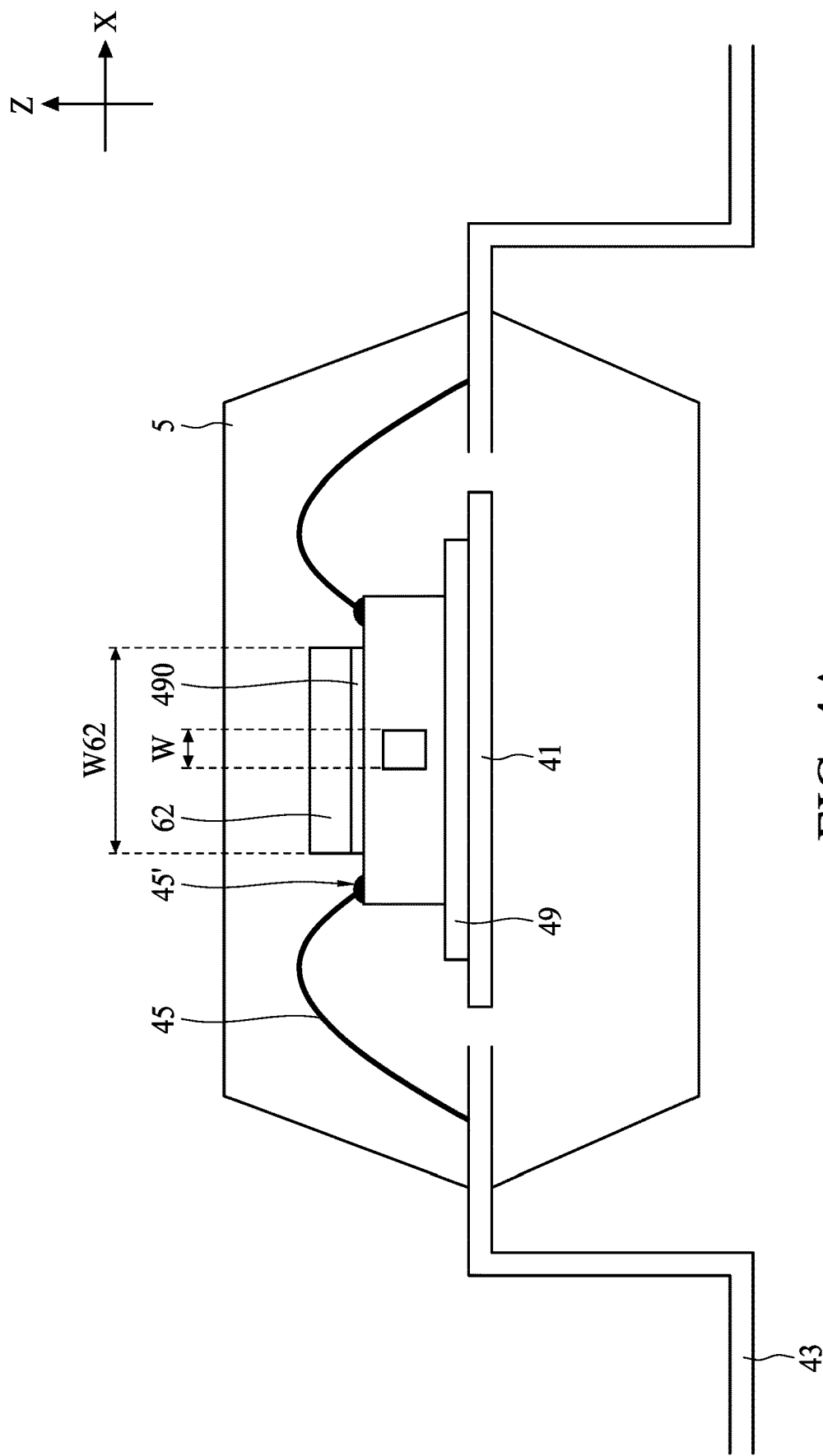
FIG. 4A to FIG. 4E are cross sections of package structures, in accordance with some embodiments of the present disclosure.

Referring to FIG. 1 and FIG. 4A, FIG. 4A is a cross section of a package structure, in accordance with some embodiments of the present disclosure. In operation 103, in some embodiments, an upper magnetic field shielding 62 is disposed above the semiconductor chip 4. In some embodiments, the upper magnetic field shieldings 62 may be in a form of foil, plate, block, layer, multiple laminated layers, film, three-dimension solid figure, or the like. In some embodiments, the upper magnetic field shielding 62 includes paramagnetic materials, ferromagnetic materials, ferrite materials, high permeability magnetization materials, high saturation magnetization materials, compounds or alloy including Fe, Co, Ni, or the like. Thence, the upper magnetic field shielding 62 can provide a significantly lower reluctance path for external magnetic field or stray magnetic field, as the details will be subsequently discussed in FIG. 6B' and FIG. 6B". Thus, the upper magnetic field shielding 62 may help hindering the external magnetic field or stray magnetic field from reaching the magnetic device 2, further alleviating anomalous memory storage, aberrant device operations, malfunctioning or damages due to the external magnetic field or stray magnetic field. The aforementioned materials of the upper magnetic field shielding 62 may not have polarity, thus the effectiveness of the upper magnetic field shielding 62 on the magnetic device 2 is negligible. As previously discussed in operation 103, the upper magnetic field shielding 62 is disposed based on at least a criterion pertinent to at least a feature of the magnetic device 2. In some embodiments, a width W62 of the upper magnetic field shielding 62 is greater than the width W of the magnetic device 2. The magnetic device 2 may be under a projection area of the upper magnetic field shielding 62 when viewed in the thickness direction z, thus the effectiveness of hindering the external magnetic field may be improved. In some embodiments, the upper magnetic field shielding 62 is attached to the first surface 4a of the semiconductor chip 4 by an adhesive material 490. A material of the adhesive layer 49 may, or may not be the same with the adhesive material 490. The upper magnetic field shielding 62 is further covered by the molding 5. Securing the upper magnetic field shielding 62 by surrounded with molding 5 and attached with the adhesive material 490 to the semiconductor chip 4 may help improving the mechanical strength of the upper magnetic field shielding 62 from detaching. It may also be in accordance for the design of the semiconductor chip 4 and/or the subsequent process, or help realizing miniaturization. A portion of the first surface 4a is exposed from the upper magnetic field shielding 62 in order to provide the first bonding surface 45' for connecting the bonding wire 45 to the first surface 4a. The exposed portion of the first surface 4a except the bonded first bonding surface 45' is covered by the molding 5.

Figure 4B:
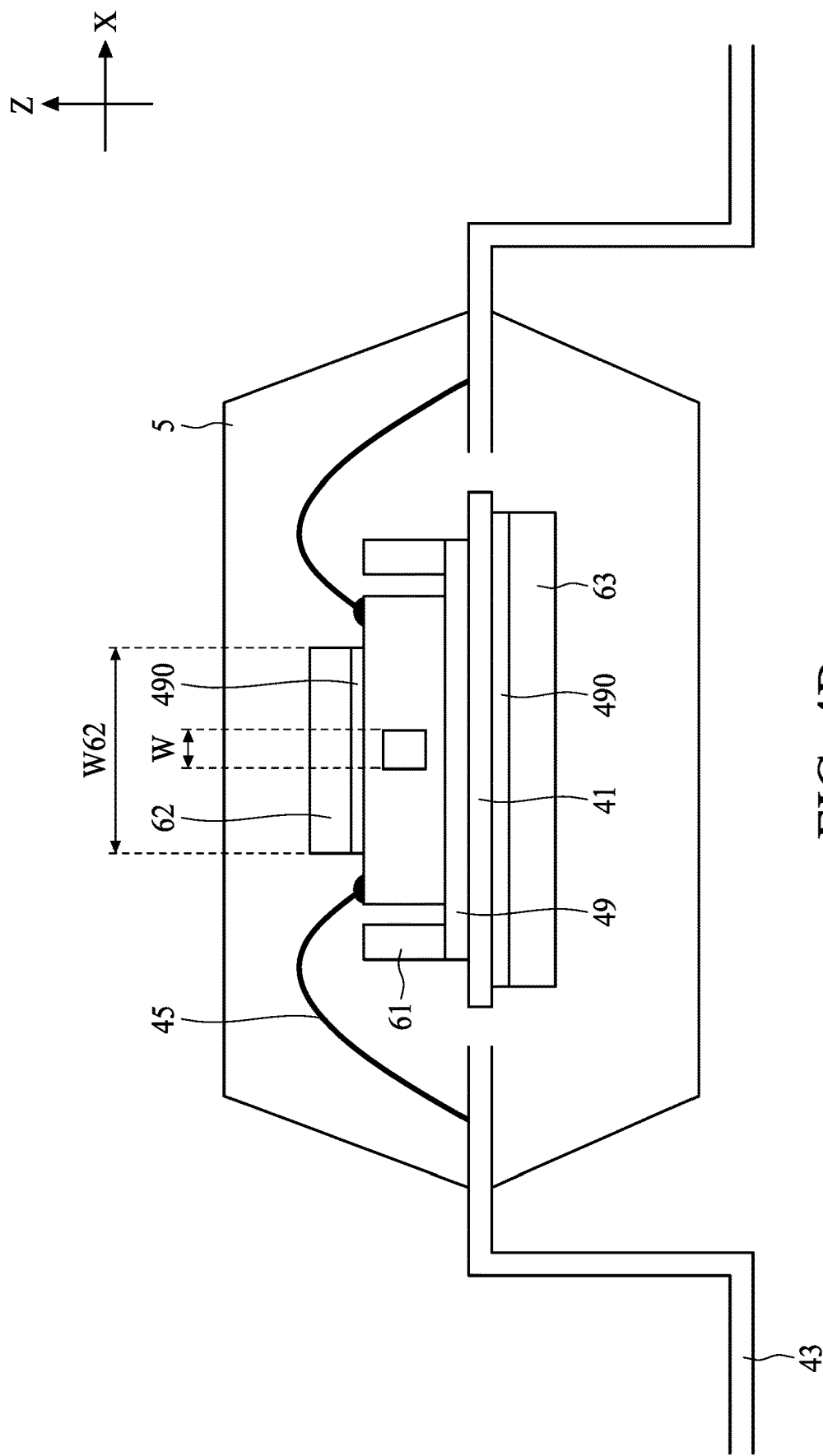

Referring to FIG. 4B, FIG. 4B is a cross section of a package structure, in accordance with some embodiments of the present disclosure. The package structure may further include a lateral magnetic field shielding 61 laterally surrounding at least a portion of the third surface 4e of the semiconductor chip 4 and/or a lower magnetic field shielding 63 over the second surface 4b of the semiconductor chip 4 in order to enhance the effectiveness of hindering external magnetic field from various directions. The lateral magnetic field shielding 61 and the lower magnetic field shielding 63 may also include paramagnetic materials, ferromagnetic materials, ferrite materials, high permeability magnetization materials, high saturation magnetization materials, compounds or alloy including Fe, Co, Ni, or the like. The criteria and the methods of disposing the lateral magnetic field shielding 61 and the lower magnetic field shielding 63 will be subsequently discussed in FIG. 5A to FIG. 5G and FIG. 6A to FIG. 6G respectively. The criteria and the methods of disposing the lateral magnetic field shielding 61 illustrated in FIG. 5B to FIG. 5G and the lower magnetic field shielding 63 illustrated in FIG. 6A to FIG. 6G may be incorporated thereto. For the purpose of conciseness, the lateral magnetic field shielding 61 and the lower magnetic field shielding 63 are both included in FIG. 4C to FIG. 4E. However, note that some other embodiments may only include one of the lateral magnetic field shielding 61 and the lower magnetic field shielding 63, or may neither include the lateral magnetic field shielding 61 nor the lower magnetic field shielding 63.

Figure 4C:
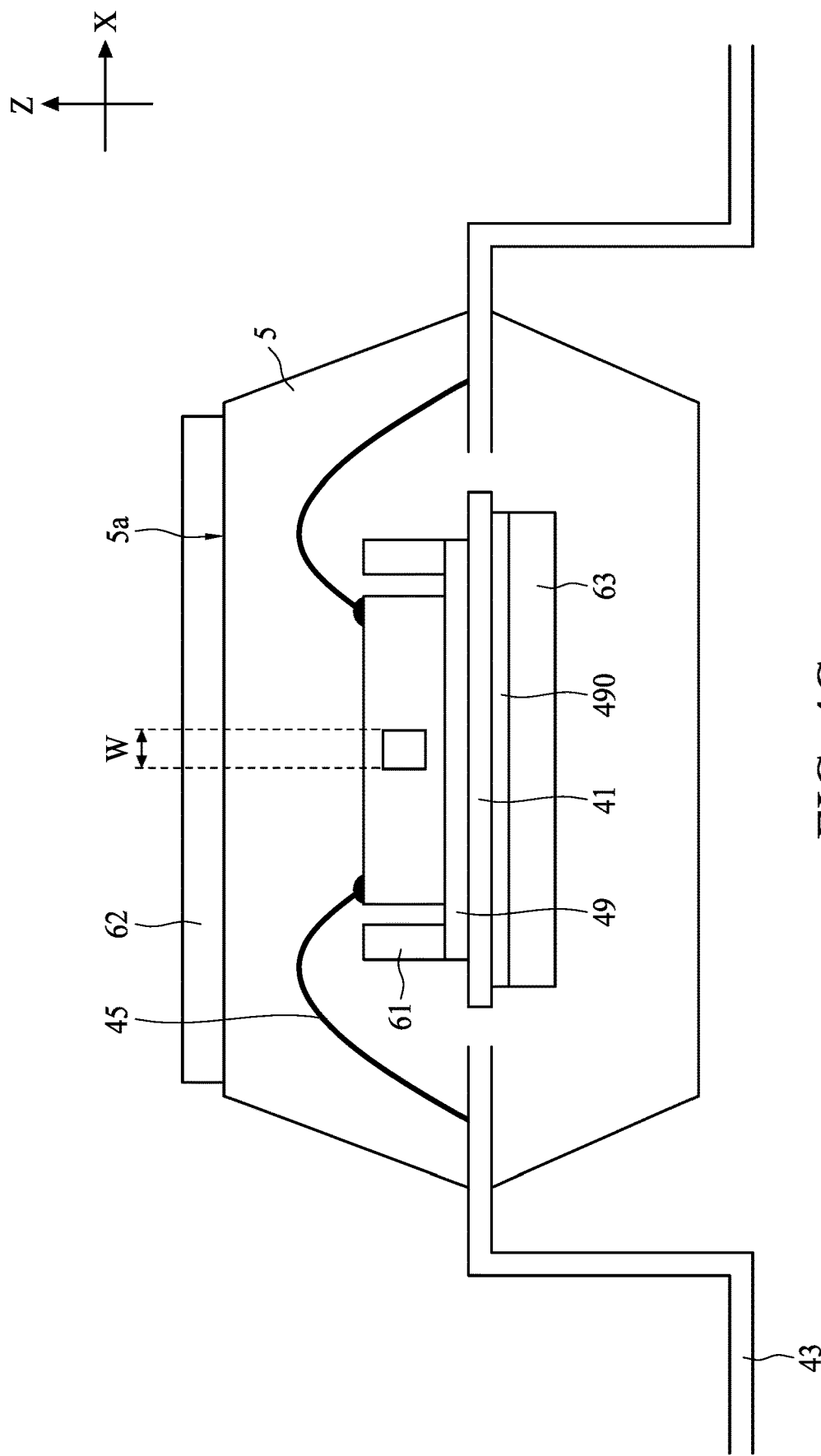

Referring to FIG. 4C, FIG. 4C is a cross section of a package structure, in accordance with some embodiments of the present disclosure. In some embodiments, the upper magnetic field shielding 62 is disposed above the semiconductor chip 4 and attached on an upper external surface 5a of the molding 5. In some embodiments, the width W62 of the upper magnetic field shielding 62 is greater than the width W of the magnetic device 2. The magnetic device 2 may be under a projection area of the upper magnetic field shielding 62 when viewed in the thickness direction z, thus the effectiveness of hindering the external magnetic field may be improved. In some embodiments, disposing the upper magnetic field shielding 62 outside of the molding 5 may alleviate the mechanical stress applied on the semiconductor chip 4, or provide greater spaces for wire bonding in operation 105 due to the design of the semiconductor chip 4. In the cases of further including the lateral magnetic field shielding 61 in the embodiments illustrated in FIG. 4C, the bonding wire 45 spaces between the upper magnetic field shielding 62 and the lateral magnetic field shielding 61.

Figure 4D:
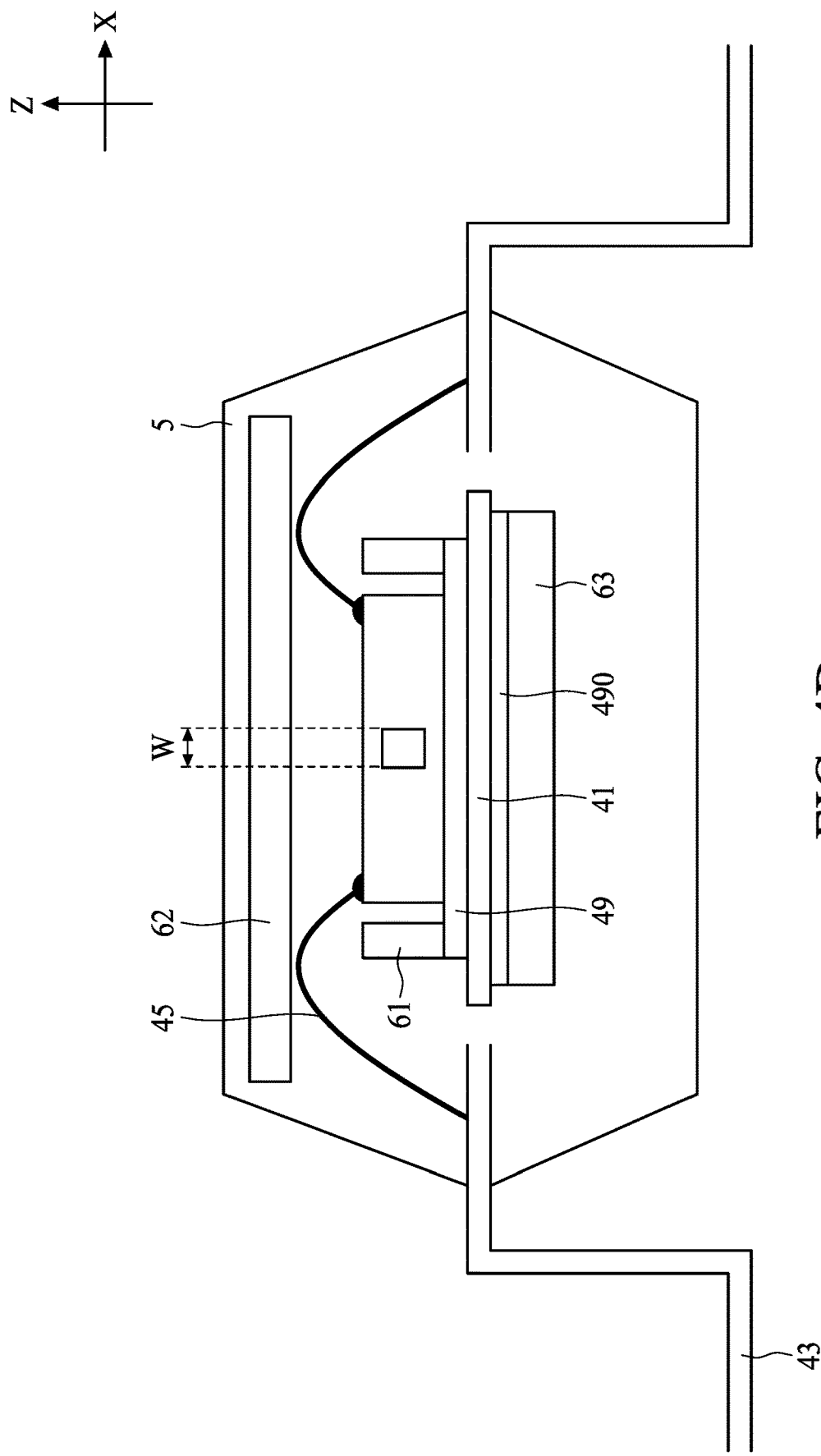

Referring to FIG. 4D, FIG. 4D is a cross section of a package structure, in accordance with some embodiments of the present disclosure. In some embodiments, the upper magnetic field shielding 62 is disposed above the semiconductor chip 4 and surrounded by the molding 5. A portion of the molding 5 spaces between the upper magnetic field shielding 62 and the semiconductor chip 4, and another portion of the molding 5 further covers a side of the upper magnetic field shielding 62 distal to the semiconductor chip 4. In some embodiments, the width W62 of the upper magnetic field shielding 62 is greater than the width W of the magnetic device 2. The magnetic device 2 may be under a projection area of the upper magnetic field shielding 62 when viewed in the thickness direction z, thus the effectiveness of hindering the external magnetic field may be improved. In some embodiments, surrounding the upper magnetic field shielding 62 with the molding 5 while spacing the upper magnetic field shielding 62 and the semiconductor chip 4 by a portion of molding 5 may alleviate the mechanical stress applied on the semiconductor chip 4, provide greater spaces for wire bonding in operation 105 due to the design of the semiconductor chip 4, and/or help improving the mechanical strength of the upper magnetic field shielding 62 from detaching the cases of further including the lateral magnetic field shielding 61 in the embodiments illustrated in FIG. 4D, the bonding wire 45 spaces between and extends through a gap between the upper magnetic field shielding 62 and the lateral magnetic field shielding 61.

Figure 4E:
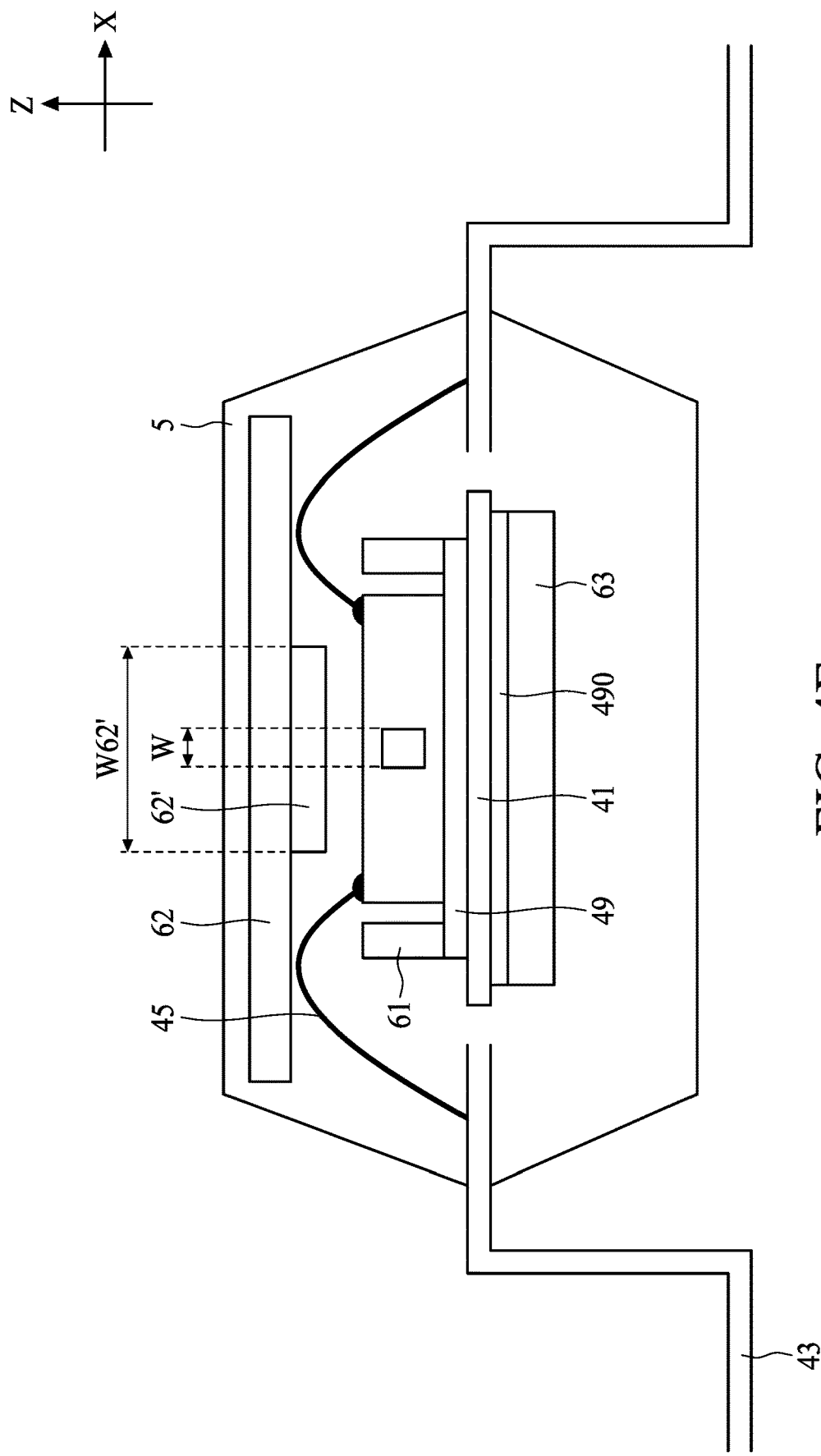

Referring to FIG. 4E, FIG. 4E is a cross section of a package structure, in accordance with some embodiments of the present disclosure. In some embodiments, the upper magnetic field shielding 62 is disposed above the semiconductor chip 4 and surrounded by the molding 5. At least one intermediate magnetic field shielding 62' spaces between the upper magnetic field shielding 62 and the semiconductor chip 4. The intermediate magnetic field shielding 62' may, or may not be attached to the upper magnetic field shielding 62. In some embodiments, the intermediate magnetic field shielding 62' is an extension of the upper magnetic field shielding 62. A portion of the molding 5 spaces between the upper magnetic field shielding 62 and the semiconductor chip 4, and another portion of the molding 5 further covers a side of the upper magnetic field shielding 62 distal to the semiconductor chip 4. In some embodiments, the width W62 of the upper magnetic field shielding 62 is greater than the width W of the magnetic device 2. A width W62' of the intermediate magnetic field shielding 62' may, or may not be greater than the width W of the magnetic device 2. In some embodiments, the width W62 is greater than the width W62'. The magnetic device 2 may be under a projection area of the upper magnetic field shielding 62, and in some embodiments furthery being under a projection area of the intermediate magnetic field shielding 62' when viewed in the thickness direction z, thus the effectiveness of hindering the external magnetic field may be enhanced since the intermediate magnetic field shielding 62' may provide an additional lower reluctance path for external magnetic field. In some embodiments, surrounding the upper magnetic field shielding 62 and the intermediate magnetic field shielding 62' with the molding 5 may help improving the mechanical strength of the upper magnetic field shielding 62 and the intermediate magnetic field shielding 62' from detaching. In the cases of further including the lateral magnetic field shielding 61 in the embodiments illustrated in FIG. 4D, the bonding wire 45 spaces between and extends through a gap between the upper magnetic field shielding 62 and the lateral magnetic field shielding 61. In some embodiments, the intermediate magnetic field shielding 62' spaces between a plurality of the bonding wires 45.

Figure 5A:
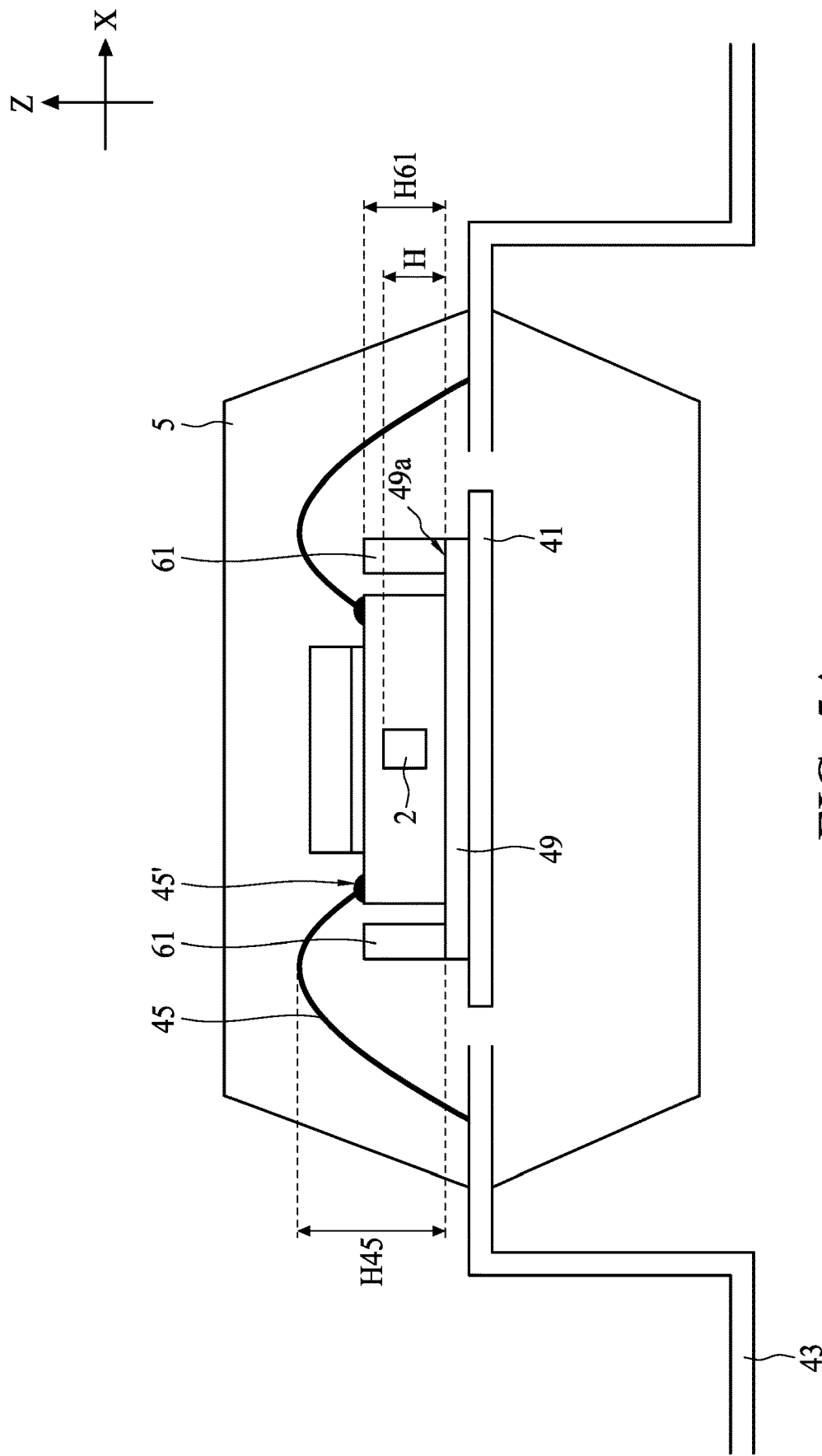
FIG. 5A and FIG. 5B are cross sections of package structures, in accordance with some embodiments of the present disclosure.

Referring to FIG. 1 and FIG. 5A, FIG. 5A is a cross section of a package structure, in accordance with some embodiments of the present disclosure. In operation 103, in some embodiments, a lateral magnetic field shielding 61 is disposed to at least laterally surrounding the third surface 4c of the semiconductor chip 4. In some embodiments, the lateral magnetic field shielding 61 may be in a form of foil, plate, block, layer, multiple laminated layers, film, three-dimension solid figure, or the like. The criteria of selecting the material of the lateral magnetic field shielding 61 are similar to the material of the upper magnetic field shielding 62 (previously discussed in FIG. 4A). Thence, the lateral magnetic field shielding 61 can provide a significantly lower reluctance path for external magnetic field or stray magnetic field, as the details will be subsequently discussed in FIG. 5B', FIG. 6B', and FIG. 6B". Thus, the lateral magnetic field shielding 61 may help hindering the external magnetic field or stray magnetic field from reaching the magnetic device 2, further alleviating anomalous memory storage, aberrant device operations, malfunctioning or damages due to the external magnetic field or stray magnetic field. As previously discussed in operation 103, the lateral magnetic field shielding 61 is disposed based on at least a criterion pertinent to at least a feature of the magnetic device 2. In some embodiments, a height 1161 of the lateral magnetic field shielding 61 is greater than the height H. The magnetic device 2 may be under a projection area of the upper magnetic field shielding 62 when viewed in the direction x, thus the effectiveness of hindering the external magnetic field may be improved. In some embodiments, the lateral magnetic field shielding 61 is attached to the mounting surface 49a by the adhesive layer 49. In some embodiments, the lateral magnetic field shielding 61 is disposed on the portion of the mounting surface 49a exposed from the semiconductor chip 4. The lateral magnetic field shielding 61 is disposed inside the molding 5. Securing the lateral magnetic field shielding 61 by covering with molding 5 and attaching with the adhesive layer 49 may help improving the mechanical strength of the lateral magnetic field shielding 61 from detaching. It may also be in accordance for the design of the semiconductor chip 4. In some embodiments, the lateral magnetic field shielding 61 is disposed between the bonding wire 45 and the third surface 4c to help realizing miniaturization and enhance the effectiveness of hindering the external magnetic field, as will be subsequently discussed in FIG. 5B. Furthery, in order to obviate constructive interference, the height 1161 of the lateral magnetic field shielding 61 is less than a height 1145 of the bonding wire 45, as the height H45 is measured from the mounting surface 49a to a point on the bonding wire 45 distal to the mounting surface 49a.

Figure 5B:
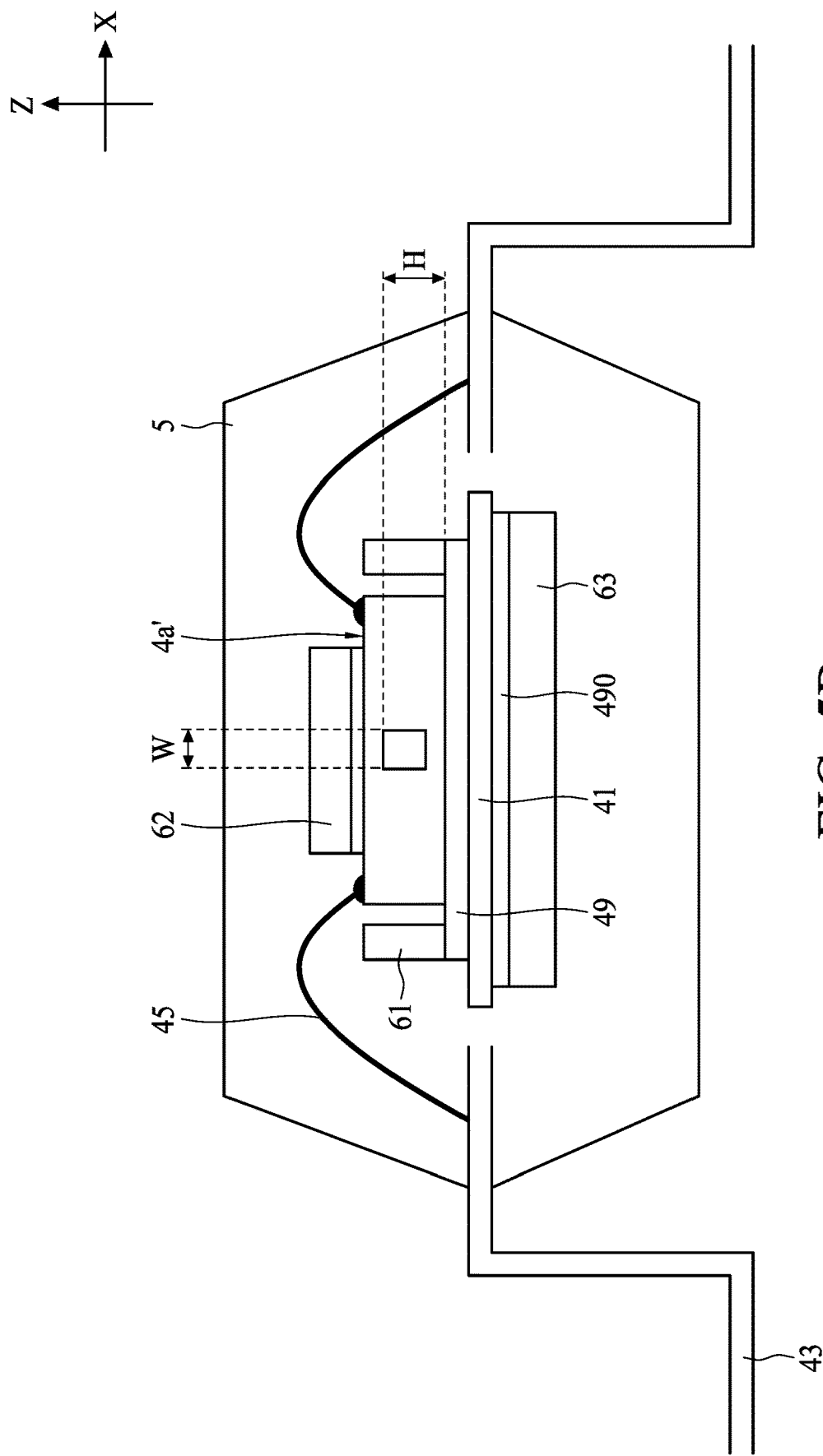
Figure 5B:
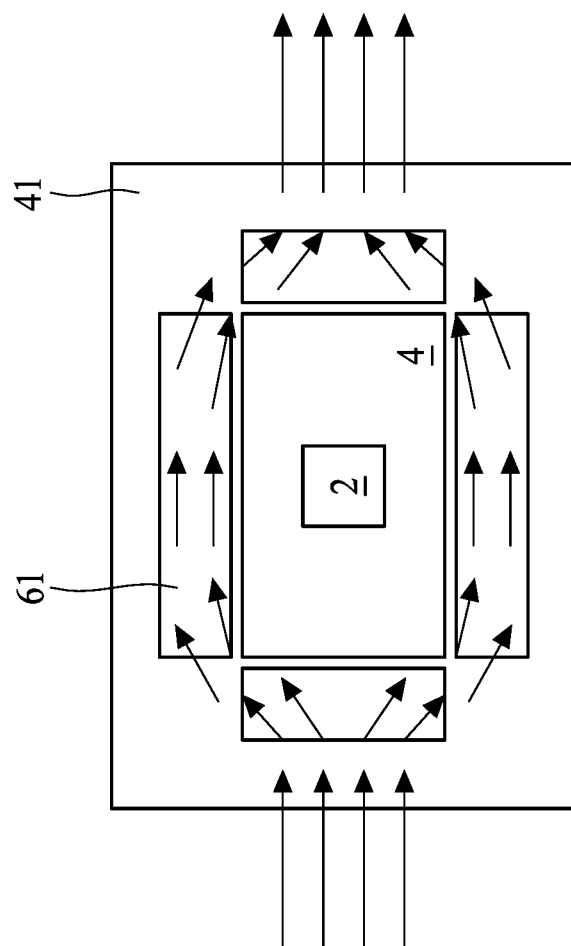

Referring to FIG. 5B, FIG. 5B is a cross section of a package structure, in accordance with some embodiments of the present disclosure. The package structure may further include the upper magnetic field shielding 62 previously discussed in FIG. 4A to FIG. 4E over the first surface 4a and/or a lower magnetic field shielding 63 over the second surface 4b, which will be subsequently discussed in FIG. 6A to FIG. 6G, in order to enhance the effectiveness of hindering external magnetic field from various directions. In the case of incorporating the upper magnetic field shielding 62 mentioned the embodiments in FIG. 4B, wherein the upper magnetic field shielding 62 is attached to the first surface 4a of the semiconductor chip 4, a portion 4a' of the first surface 4a is exposed from the upper magnetic field shielding 62. The area of the portion 4a' may provide the first bonding surface 45' for wire bonding operation of operation 105.

However, the portion 4a' may be a gap that allows the external magnetic field to pass through, thence the area of the portion 4a' may be reduced to alleviate the affection of external magnetic field on the magnetic device 2.

Referring to FIG. 5B', FIG. 5B' is a schematic diagrams illustrating package structures under an external magnetic field from a top view, in accordance with some embodiments of the present disclosure. The arrows illustrate the directions of magnetic flux throughout the package structure. The lateral magnetic field shielding 61 can provide a significantly lower reluctance path for lateral external magnetic field, at least a portion of the magnetic flux may flow through the lateral magnetic field shielding 61 toward outside. Thence a portion of lateral external magnetic field passing through the magnetic device 2 may be reduced.

Figure 5D:
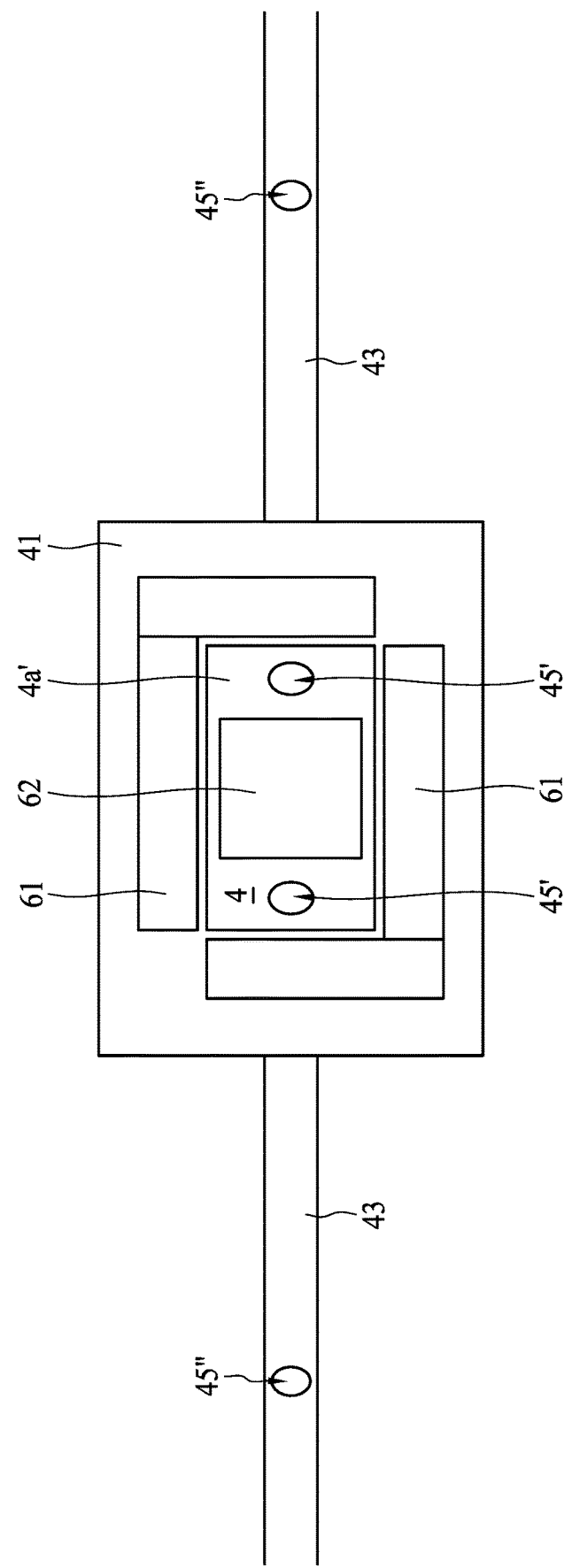
Figure 5E:
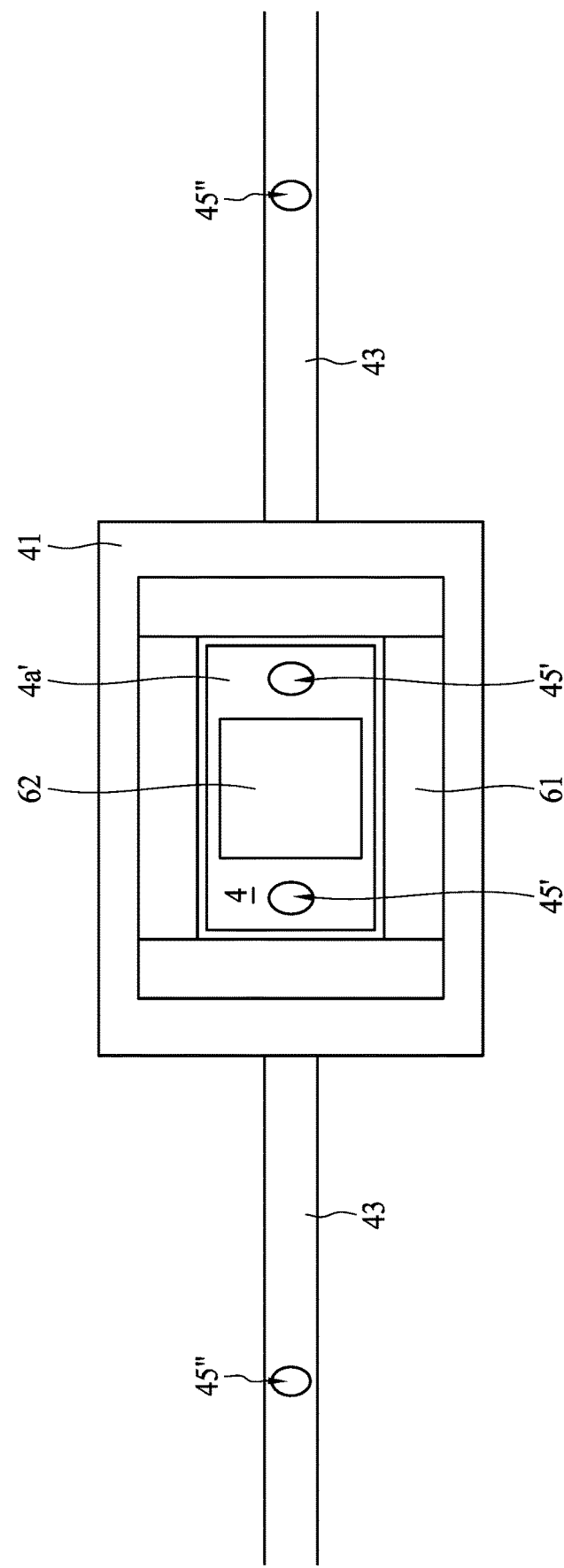

Referring to FIG. 5C to FIG. 5E, FIG. 5C to FIG. 5E are top views of package structures, in accordance with some embodiments of the present disclosure. The lateral magnetic field shielding 61 is disposed between the bonding wire 45 and the third surface 4c. The portion 4a' having the first bonding surface 45' is exposed form the upper magnetic field shielding 62. The bonding wire 45' is in a state of crossing the lateral magnetic field shielding 61, thence lateral magnetic field shielding 61 is between the first bonding surface 45' and the second bonding surface 45" when viewed in the thickness direction z. Due to the design of the package or fabrication of the lateral magnetic field shielding 61, the lateral magnetic field shielding 61 may be designed in various shape or formations. For example, in some embodiments, as shown in FIG. 5C, the semiconductor chip 4 may be at least partially surrounded by four lateral magnetic field shielding 61, with each lateral magnetic field shielding 61 surrounding an edge of the semiconductor chip 4. In some embodiments, as shown in FIG. 5D, the semiconductor chip 4 may be at least partially surrounded by two lateral magnetic field shielding 61, with each lateral magnetic field shielding 61 surrounding two edges of the semiconductor chip 4. In some embodiments, as shown in FIG. 5E, the semiconductor chip 4 may be at least partially surrounded by one lateral magnetic field shielding 61, with the lateral magnetic field shielding 61 surrounding the semiconductor chip 4. In some embodiments, the lateral magnetic field shielding 61 has constant width. However, the present disclosure is not limited thereto, as other forms of the lateral magnetic field shielding 61 at least partially surrounding the semiconductor chip 4 are also under consideration.

Figure 5F:
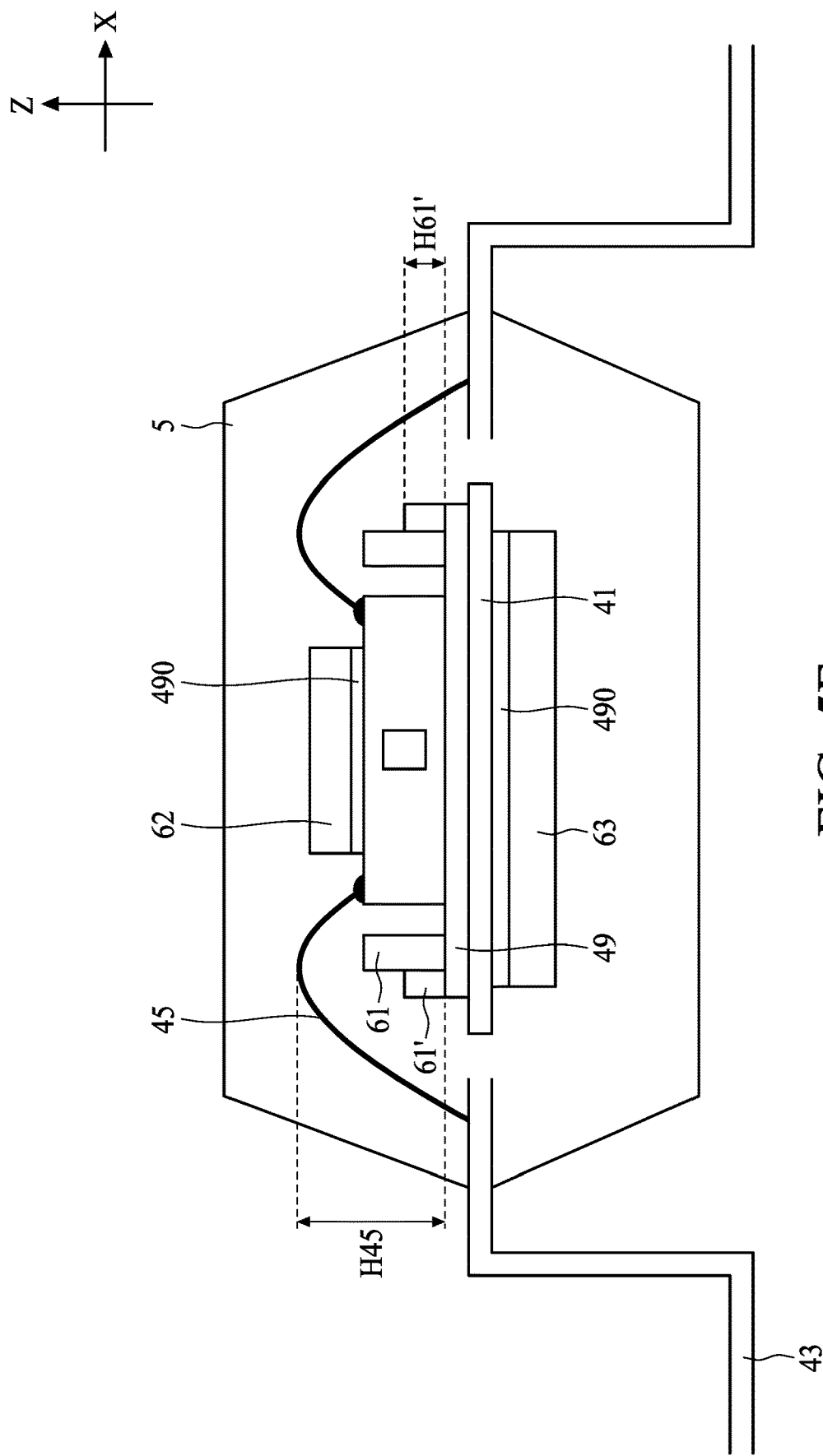
FIG. 5F to FIG. 5G are cross sections of package structures, in accordance with some embodiments of the present disclosure.
Figure 5G:
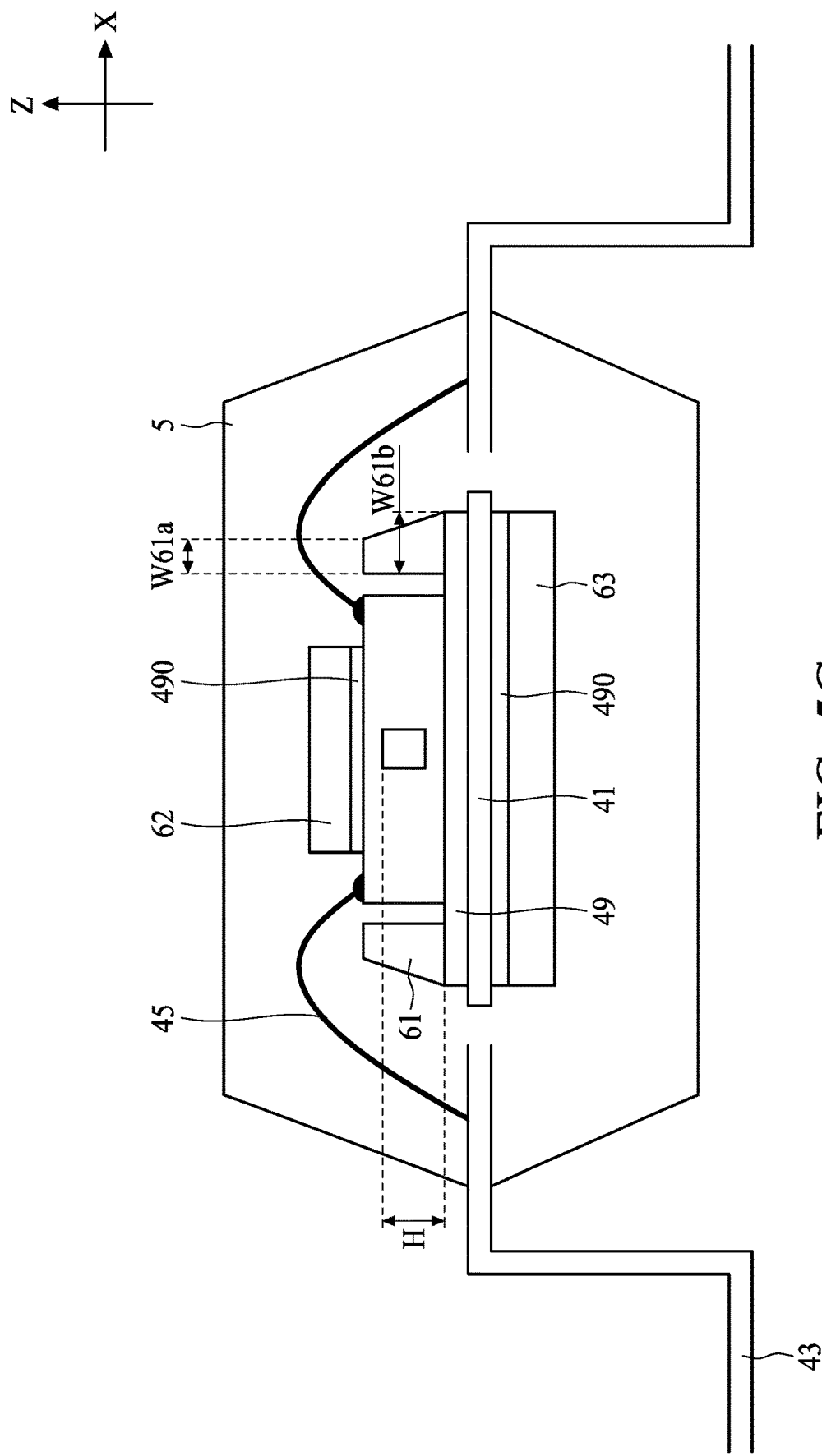

For the purpose of conciseness, the upper magnetic field shielding 62 and the lower magnetic field shielding 63 are both included in FIG. 5F and FIG. 5G. However, note that some other embodiments may only include one of the upper magnetic field shielding 62 and the lower magnetic field shielding 63, or may neither include the upper magnetic field shielding 62 nor the lower magnetic field shielding 63.

Referring to FIG. 5F, FIG. 5F is a cross section of a package structure, in accordance with some embodiments of the present disclosure. An outer magnetic field shielding 61' can be furtherly disposed between the bonding wire 45 and the lateral magnetic field shielding 61 previously mentioned in FIG. 5A to FIG. 5E. In some embodiments, the outer magnetic field shielding 61' is disposed adjacent to the lateral magnetic field shielding 61. The effectiveness of hindering the external magnetic field may be enhanced since the outer magnetic field shielding 61' may provide an additional lower reluctance path for lateral external magnetic field. In some embodiments, surrounding the upper magnetic field shielding 62 and the intermediate magnetic field shielding 62' with the molding 5 may help improving the mechanical strength of the lateral magnetic field shielding 61 and the outer magnetic field shielding 61' from detaching. In order to obviate constructive interference, a height H61' of the outer magnetic field shielding 61' is less than the H45 of the bonding wire 45.

Referring to FIG. 5G, FIG. 5G is a cross section of a package structure, in accordance with some embodiments of the present disclosure. The lateral magnetic field shielding 61 previously mentioned in FIG. 5A to FIG. 5E may have a wedge shape, wherein a bottom width W61b of the lateral magnetic field shielding 61 is greater than a top width W61a of the lateral magnetic field shielding 61. The contact area of the lateral magnetic field shielding 61 and the adhesive layer 49 can be increased, further enhancing the adhesive strength.

Figure 6A:
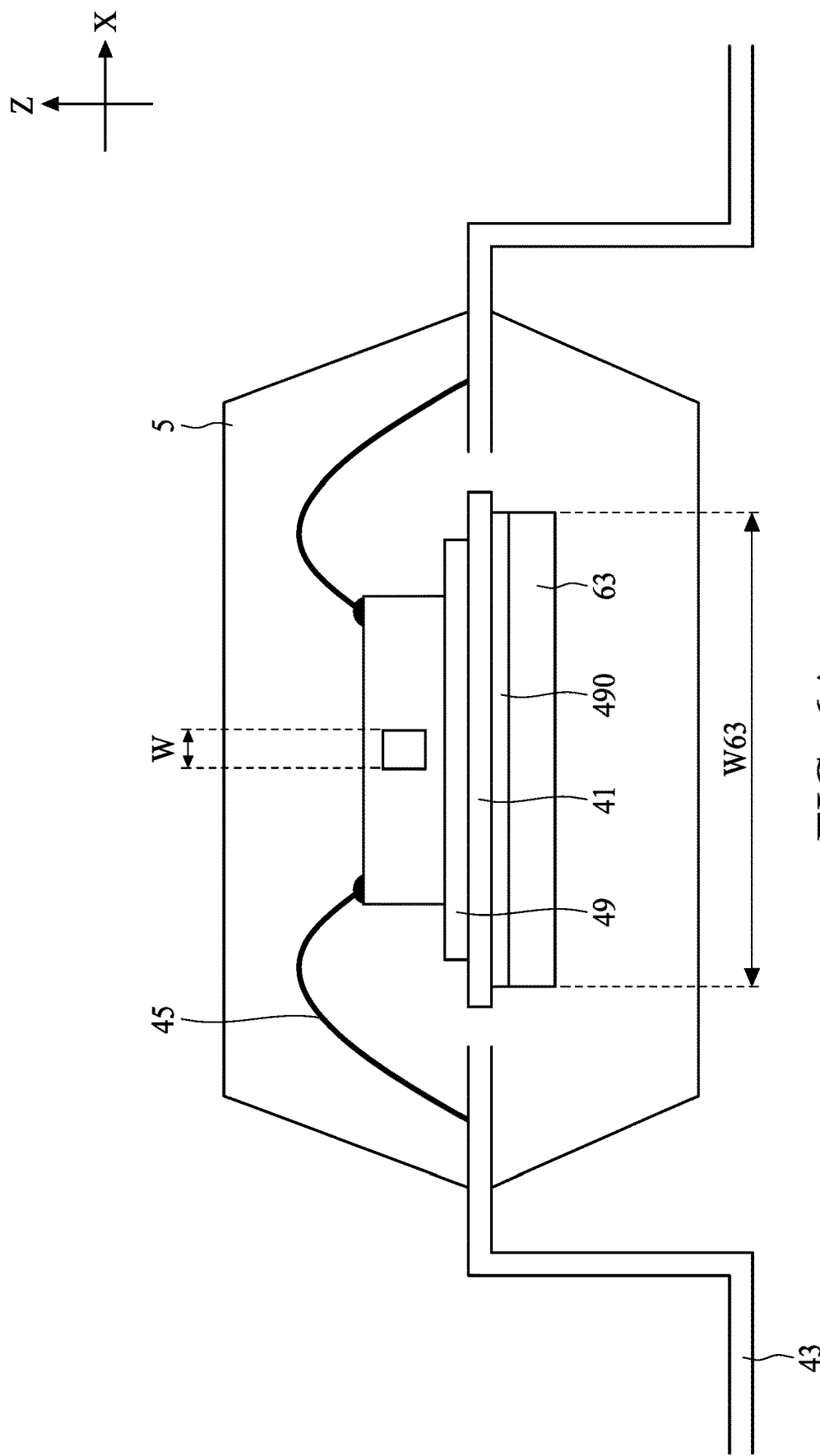
FIG. 6A to FIG. 6B are cross sections of package structures, in accordance with some embodiments of the present disclosure.

Referring to FIG. 1 and FIG. 6A, FIG. 6A is a cross section of a package structure, in accordance with some embodiments of the present disclosure. In operation 103, in some embodiments, a lower magnetic field shielding 63 is disposed under the second surface 4b of the semiconductor chip 4, distal to the first surface 4a. In some embodiments, the lower magnetic field shielding 63 may be in a form of foil, plate, block, layer, multiple laminated layers, film, three-dimension solid figure, or the like. The criteria of selecting the material of the lateral magnetic field shielding 63 are similar to the material of the upper magnetic field shielding 62 (previously discussed in FIG. 4A). Thence, the lower magnetic field shielding 63 can provide a significantly lower reluctance path for external magnetic field or stray magnetic field, as the details will be subsequently discussed in FIG. 6B', and FIG. 6B". Thus, the lower magnetic field shielding 63 may help hindering the external magnetic field or stray magnetic field from reaching the magnetic device 2, further alleviating anomalous memory storage, aberrant device operations, malfunctioning or damages due to the external magnetic field or stray magnetic field. As previously discussed in operation 103, the lower magnetic field shielding 63 is disposed based on at least a criterion pertinent to at least a feature of the magnetic device 2. In some embodiments, a width W63 of the lower magnetic field shielding 63 is greater than the width W of the magnetic device 2. The magnetic device 2 may be under a projection area of the lower magnetic field shielding 62 when viewed in the direction −z, thus the effectiveness of hindering the external magnetic field may be improved. In some embodiments, the lower magnetic field shielding 63 is attached to the second surface 4b of the semiconductor chip 4 by an adhesive material 490. The lower magnetic field shielding 63 is disposed inside the molding 5. Securing the lower magnetic field shielding 63 by covering with molding 5 and attaching with the adhesive material 490 may help improving the mechanical strength of the lower magnetic field shielding 63 from detaching. It may also be in accordance for the design of the semiconductor chip 4 and/or the subsequent process, or help realizing miniaturization.

Figure 6B:
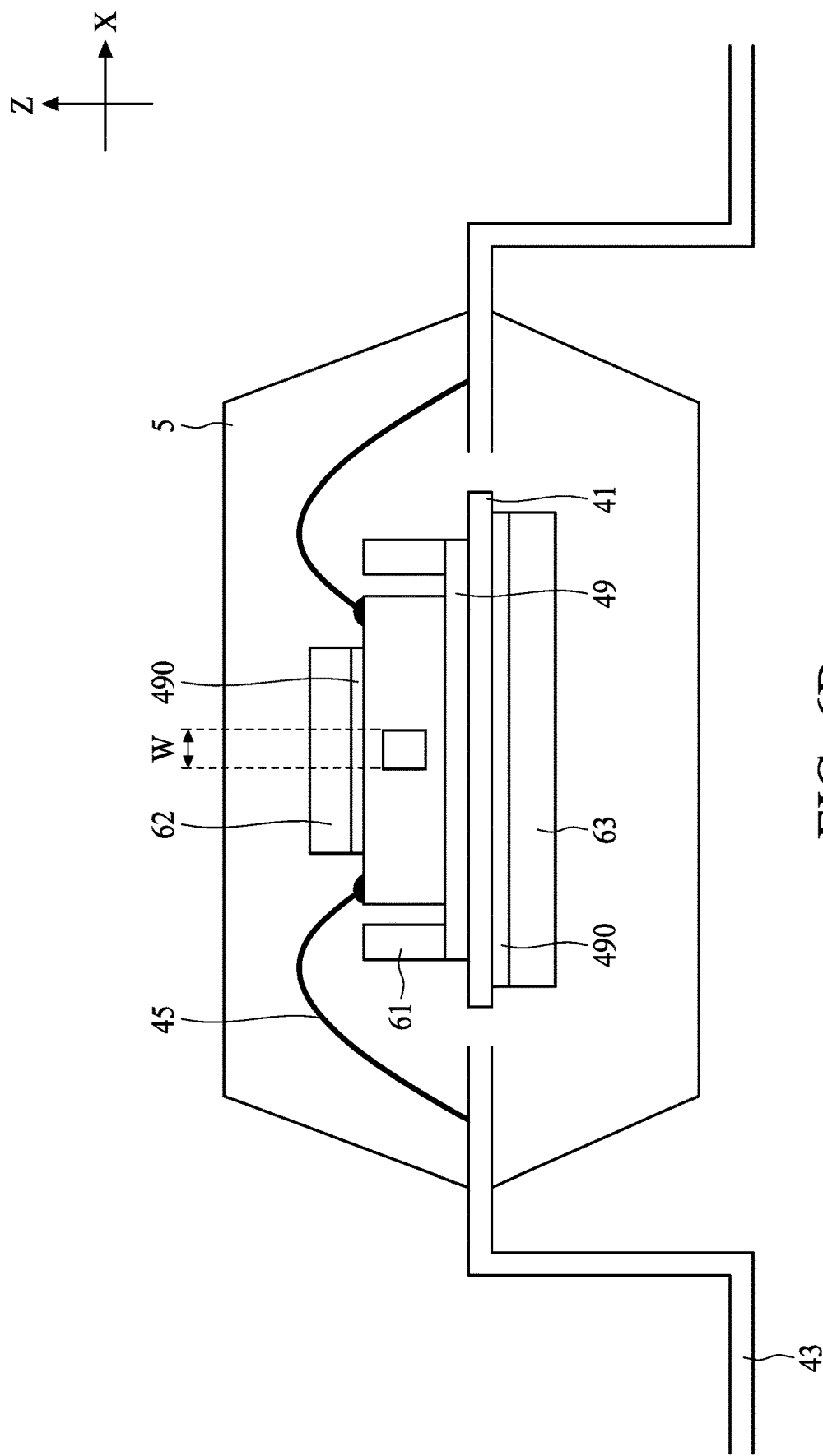

Referring to FIG. 6B, FIG. 6B is a cross section of a package structure, in accordance with some embodiments of the present disclosure. The package structure may further include the upper magnetic field shielding 62 and the lateral magnetic field shielding 61 previously discussed in FIG. 4A to FIG. 4E and FIG. 5A to FIG. 5G, respectively, in order to enhance the effectiveness of hindering external magnetic field from various directions. The aforesaid criteria of disposing the upper magnetic field shielding 62 and the lateral magnetic field shielding 61 can be incorporated herein.

Referring to FIG. 6B', FIG. 6B' is a schematic diagrams illustrating package structures under an external magnetic field from a cross sectional view, in accordance with some embodiments of the present disclosure. Herein the arrows illustrate the directions of magnetic flux throughout the package structure. The package structure illustrated in FIG. 6B is used as an exemplary demonstration. The upper magnetic field shielding 62, the lateral magnetic field shielding 61, and the lower magnetic field shielding 63 can provide a significantly lower reluctance path for external magnetic field applied from over the semiconductor chip 4. At least a portion of the magnetic flux may flow through a path starting from upper magnetic field shielding 62, lateral magnetic field shielding 61, the lower magnetic field shielding 63, and to the outside. Thence a portion of lateral external magnetic field passing through the magnetic device 2 may be reduced.

Referring to FIG. 6B", FIG. 6B" is a schematic diagrams illustrating package structures under an external magnetic field from a cross sectional view, in accordance with some embodiments of the present disclosure. Herein the arrows illustrate the directions of magnetic flux throughout the package structure. The package structure illustrated in FIG. 6B is used as an exemplary demonstration. The lower magnetic field shielding 63, lateral magnetic field shielding 61, and the upper magnetic field shielding 62 can provide a significantly lower reluctance path for external magnetic field applied from over the semiconductor chip 4. At least a portion of the magnetic flux may flow through a path starting from the lower magnetic field shielding 63, the lateral magnetic field shielding 61, the upper magnetic field shielding 62, and to the outside. Thence a portion of lateral external magnetic field passing through the magnetic device 2 may be reduced.

Figure 6C:
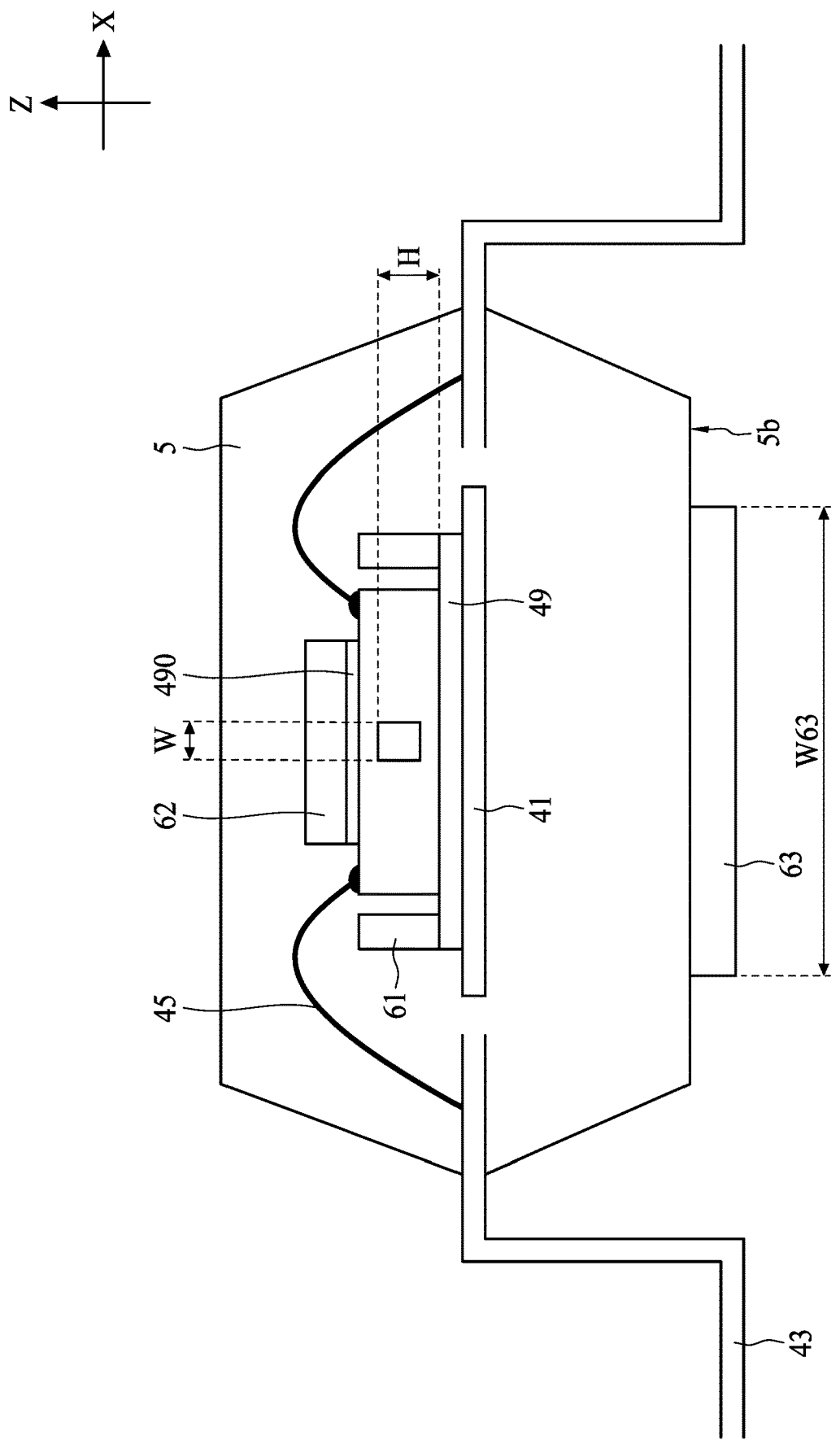
FIG. 6C to FIG. 6G are cross sections of package structures, in accordance with some embodiments of the present disclosure.
Figure 6D:
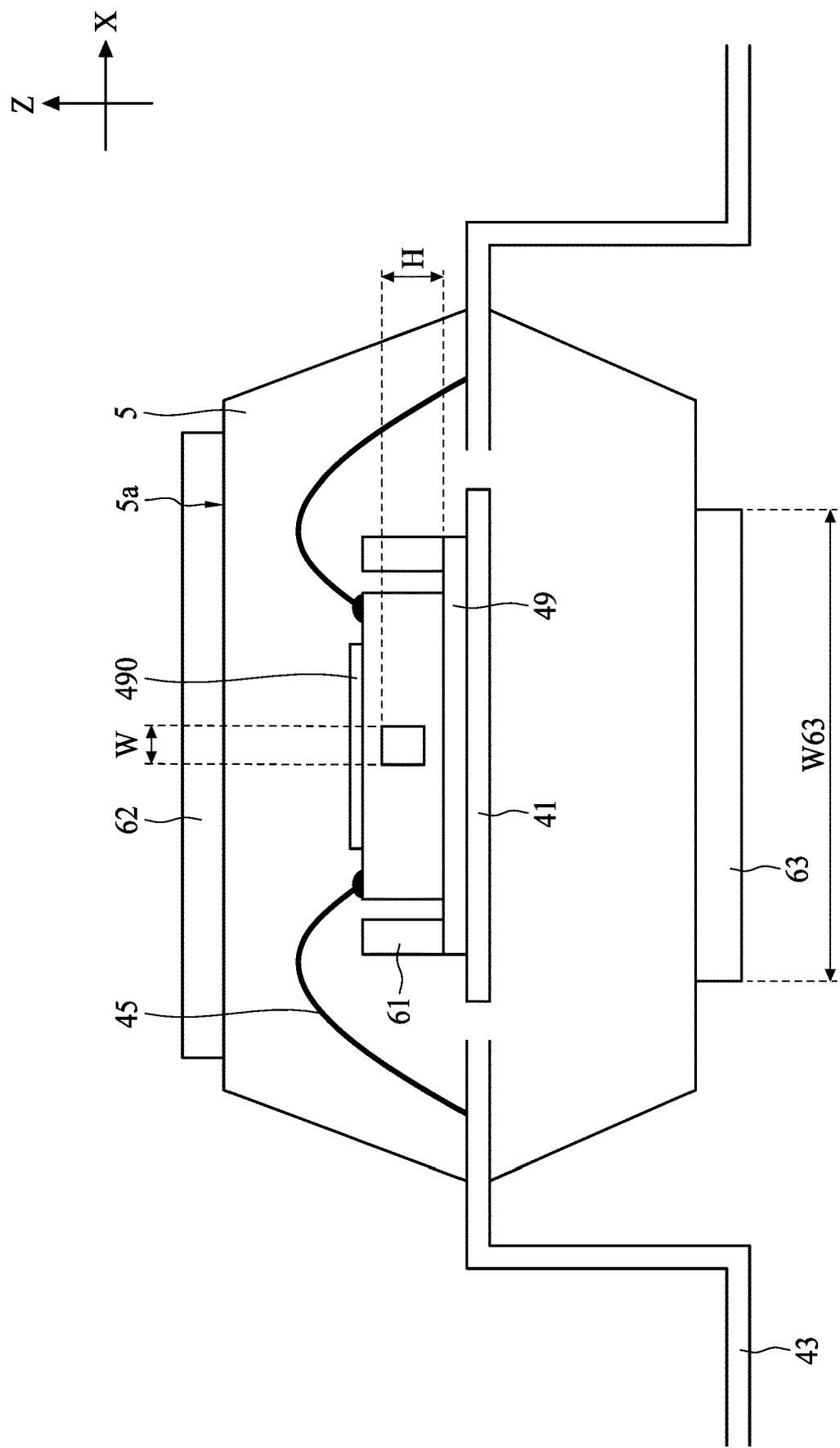
Figure 6E:
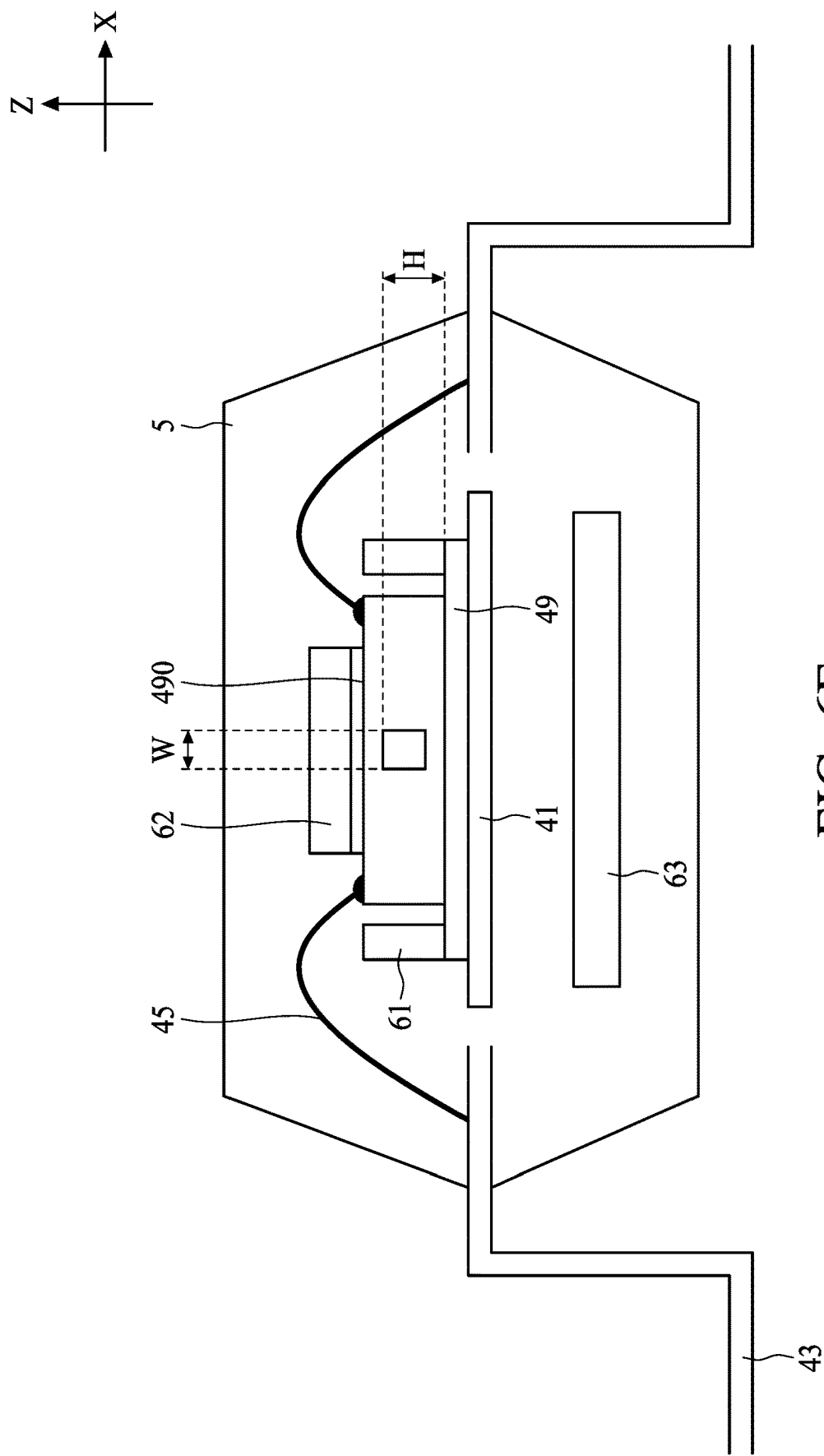
Figure 6F:
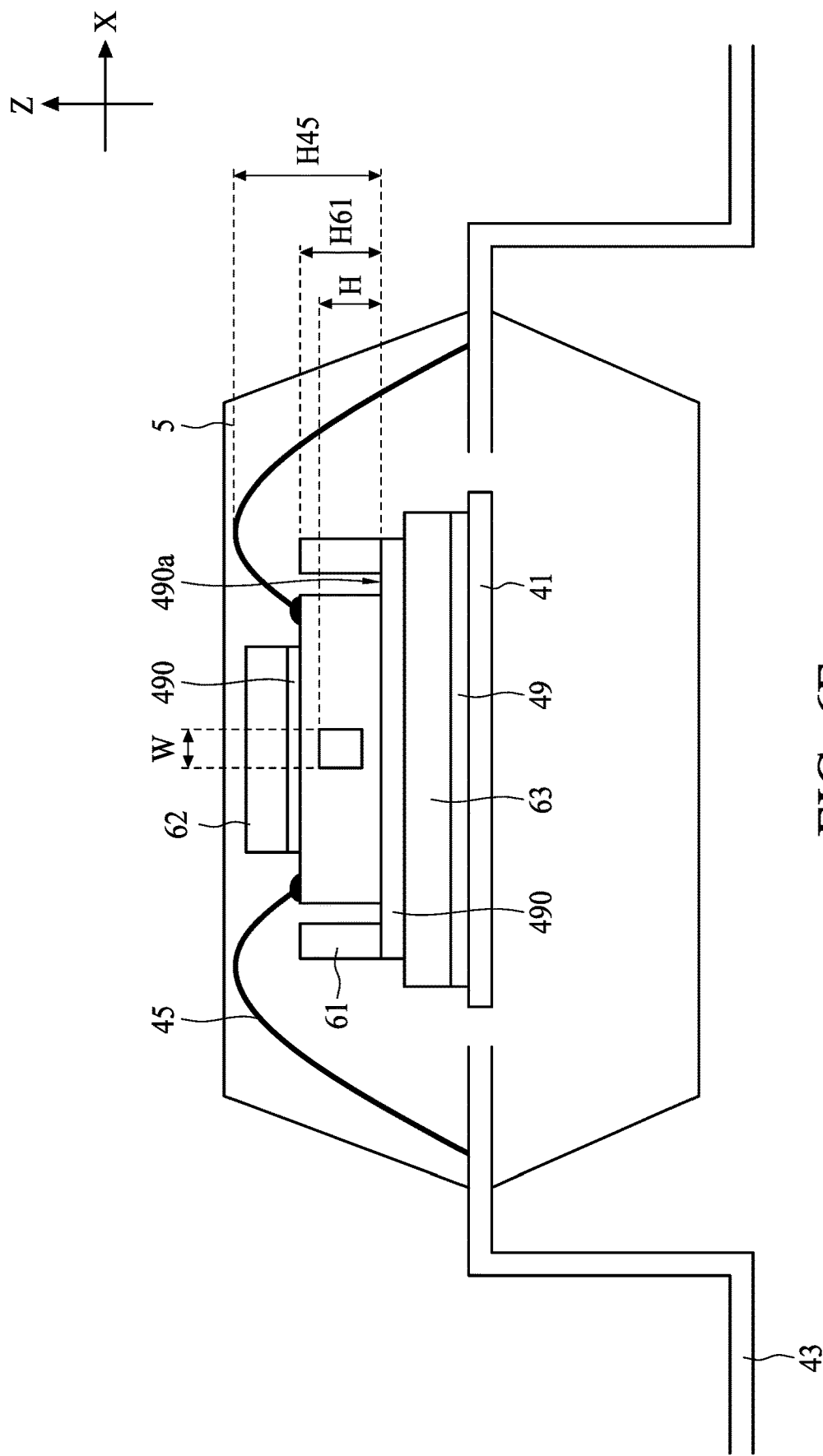
Figure 6G:
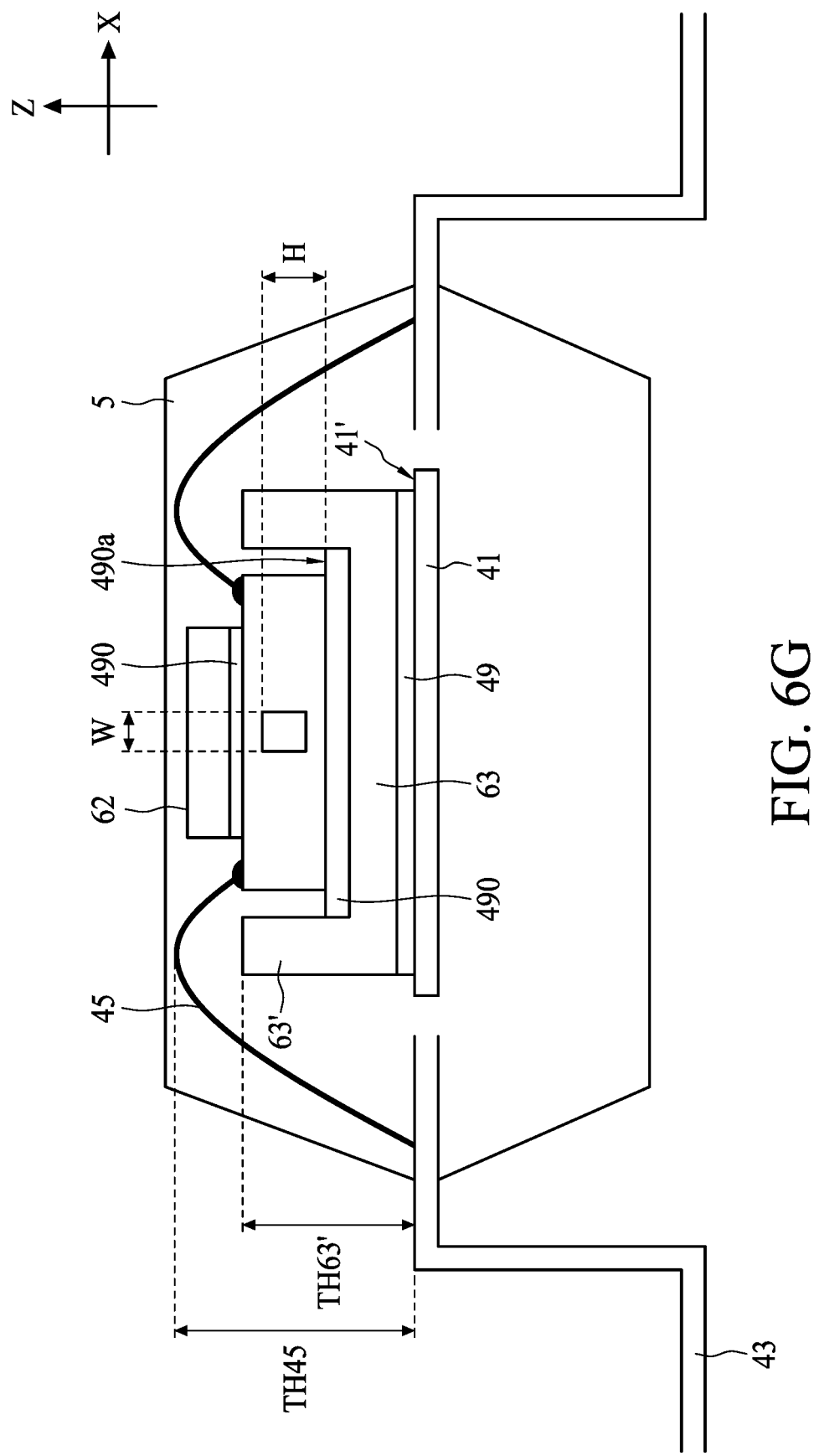

For the purpose of conciseness, the upper magnetic field shielding 62 and the lateral magnetic field shielding 61 are both included in FIG. 6C and FIG. 6G. However, note that some other embodiments may only include one of the upper magnetic field shielding 62 and the lateral magnetic field shielding 61, or may neither include the upper magnetic field shielding 62 nor the lateral magnetic field shielding 61.

Referring to FIG. 6C, FIG. 6C is a cross section of a package structure, in accordance with some embodiments of the present disclosure. In some embodiments, the lower magnetic field shielding 63 is disposed under the semiconductor chip 4 and attached on a lower external surface 5b of the molding 5. In some embodiments, the width W63 of the lower magnetic field shielding 63 is greater than the width W of the magnetic device 2. The magnetic device 2 may be under a projection area of the lower magnetic field shielding 63 when viewed in the direction −z, thus the effectiveness of hindering the external magnetic field may be improved. In some embodiments, disposing the lower magnetic field shielding 63 outside of the molding 5 may alleviate the mechanical stress applied on the semiconductor chip 4. Referring to FIG. 6O, in some embodiments, the upper magnetic field shielding 62 is disposed on the upper external surface 5a of the molding 5 and the lower magnetic field shielding 63 is disposed on the lower external surface 5b, thus the mechanical stress applied on the semiconductor chip 4 may be alleviated. Furthermore, greater spaces can be provided for wire bonding in operation 105 due to the design of the semiconductor chip 4.

Referring to FIG. 6E, FIG. 6E is a cross section of a package structure, in accordance with some embodiments of the present disclosure. In some embodiments, the lower magnetic field shielding 63 is disposed under the semiconductor chip 4 and surrounded by the molding 5. A portion of the molding 5 spaces between the lower magnetic field shielding 63 and the semiconductor chip 4, and another portion of the molding 5 further covers a side of the lower magnetic field shielding 63 distal to the semiconductor chip 4. In some embodiments, the width W63 of the lower magnetic field shielding 63 is greater than the width W of the magnetic device 2. The magnetic device 2 may be under a projection area of the lower magnetic field shielding 63 when viewed in the direction −z, thus the effectiveness of hindering the external magnetic field may be improved. In some embodiments, surrounding the lower magnetic field shielding 63 with the molding 5 while spacing the lower magnetic field shielding 63 and the semiconductor chip 4 by a portion of molding 5 may alleviate the mechanical stress applied on the semiconductor chip 4, help improving the mechanical strength of the lower magnetic field shielding 63 from detaching.

Referring to FIG. 6F, FIG. 6F is a cross section of a package structure, in accordance with some embodiments of the present disclosure. In some embodiments, the lower magnetic field shielding 63 is disposed between the semiconductor chip 4 and the lead frame pad 41. The lower magnetic field shielding 63 is attached to the lead frame pad 41 with the adhesive layer 49, and attached to the semiconductor chip 4 with the adhesive material 490. A material of the adhesive layer 49 may, or may not be the same with the adhesive material 490. In order to obviate constructive interference, the height H45 of the bonding wire measuring from a mounting surface 490a to a point on the bonding wire 45 distal to the mounting surface 490a is greater than a height H61 of the lateral magnetic field shielding 61. Disposing the lower magnetic field shielding 63 between the semiconductor chip 4 and the lead frame pad 41 may decrease the gap between the lower magnetic field shielding 63 and the lateral magnetic field shielding 61, enhancing the effectiveness of hindering the external magnetic field.

Referring to FIG. 6G, FIG. 6G is a cross section of a package structure, in accordance with some embodiments of the present disclosure. In some embodiments, the lower magnetic field shielding 63 is disposed between the semiconductor chip 4 and the lead frame pad 41. The lower magnetic field shielding 63 is attached to a mounting surface 41' of the lead frame pad 41 with the adhesive layer 49, and attached to the semiconductor chip 4 with the adhesive material 490 on the mounting surface 490a. A material of the adhesive layer 49 may, or may not be the same with the adhesive material 490. The lower magnetic field shielding 63 further including an extended portion 63' at least partially covers the third surface 4c of the semiconductor chip 4. The extended portion 63' is spacing between the bonding wire 45 and the mounting surface 41'. In order to obviate constructive interference, a total height TH45 of the bonding wire 45, measuring from the mounting surface 41' to a point on the bonding wire 45 distal to the mounting surface 41', is greater than a total height TH63 of the lower magnetic field shielding 63, measuring from the mounting surface 41' to a point on the extended portion 63' distal to the mounting surface 41'. The lower magnetic field shielding 63 including the extended portion 63' may decrease the gaps within the path of magnetic flux under external magnetic field, further improving the effectiveness of hindering the external magnetic field.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide package structure, including a semiconductor chip having a magnetic device, wherein the semiconductor chip includes a first surface perpendicular to a thickness direction of the semiconductor chip, a second surface opposite to the first surface, and a third surface connecting the first surface and the second surface, and a first magnetic field shielding at least partially surrounding the third surface.

Some embodiments of the present disclosure provide package structure, including a semiconductor chip disposed on a mounting surface, wherein the semiconductor chip includes a first surface perpendicular to a thickness direction of the semiconductor chip, a second surface opposite to the first surface and facing the mounting surface, and a third surface connecting the first surface and the second surface, a magnetic device disposed in the semiconductor chip, and a first magnetic field shielding over the second surface, and an extended portion of the first magnetic field shielding laterally surrounding the third surface.

Some embodiments of the present disclosure provide a method of forming a package structure, including providing a semiconductor chip having a magnetic device, wherein the semiconductor chip includes a first surface perpendicular to a thickness direction of the semiconductor chip, a second surface opposite to the first surface, and a third surface connecting the first surface and the second surface, disposing a first magnetic field shielding at least partially surrounding the third surface, and electrically connecting the first surface to a lead frame with a bonding wire.

What is claimed is:

1. A package structure, comprising:
a mounting pad having a mounting surface;
a semiconductor chip disposed on the mounting surface of the mounting pad,
wherein the semiconductor chip comprises:
a first surface;
a second surface opposite to the first surface and facing the mounting surface; and
a third surface connecting the first surface and the second surface;
a first magnetic field shielding, comprising:
a first portion proximal to the third surface of the semiconductor chip, wherein the first portion has a first height calculated from the mounting surface to a top surface; and
a second portion distal to the semiconductor chip, has a second height calculated from the mounting surface to a position at a surface facing away from the mounting surface, wherein the second height is less than the first height, wherein the second portion has an inclined sidewall.

2. The package structure of claim 1, wherein a total bottom width of the first magnetic field shielding is greater than a total top width of the first magnetic field shielding.

3. The package structure of claim 1, wherein an adhesive layer is between a portion of a bottom of the first magnetic field shielding and the mounting surface.

4. The package structure of claim 1, further comprising a second magnetic field shielding over the first surface of the semiconductor chip.

5. The package structure of claim 1, further comprising a third magnetic field shielding below the second surface of the semiconductor chip.

6. The package structure of claim 1, wherein the semiconductor chip comprises a magnetic tunneling junction (MTJ) device.

7. A package structure, comprising:
a mounting pad having a mounting surface;
a semiconductor chip comprising a magnetic device, wherein the semiconductor chip comprises:
a first surface;
a second surface opposite to the first surface, wherein the second surface is attached to the mounting surface of the mounting pad; and
a third surface connecting the first surface and the second surface;
a bonding wire connected to the semiconductor chip;
a first magnetic field shielding over the mounting surface and at least partially surrounding the third surface, wherein a first portion of the first magnetic field shielding is configured in L-shape in a top view perspective.

8. The package structure of claim 7, wherein the first magnetic field shielding further comprises a second portion over the mounting surface, which is configured in L-shape in a top view perspective.

9. The package structure of claim 8, wherein a first gap is between the first portion of the first magnetic field shielding and the second portion of the first magnetic field shielding.

10. The package structure of claim 8, wherein the first gap is free from being under a coverage of a vertical projection area of the bonding wire.

11. The package structure of claim 8, wherein the first gap is above the mounting surface.

12. The package structure of claim 8, wherein at least a portion of the first gap is above the second surface of the semiconductor chip.

13. A package structure, comprising:
a mounting pad having a mounting surface;
a semiconductor chip disposed on the mounting surface of the mounting pad,
wherein the semiconductor chip comprises:
a first surface;
a second surface opposite to the first surface and facing the mounting surface; and
a third surface connecting the first surface and the second surface; and
a first magnetic field shielding, at least partially surrounding the semiconductor chip in top view, and a first sidewall of the first magnetic field shielding has a first position and a second position at a cross-section of the first magnetic field shielding along a vertical direction, wherein:
the first position is proximal to a top of the first sidewall, and a first lateral distance is between the third surface of the semiconductor chip and the first position of the first sidewall;

the second position is at the first sidewall and below the first position, and a second lateral distance is between the third surface of the semiconductor chip and the second position of the first sidewall; and the second lateral distance is greater than the first lateral distance.

14. The package structure of claim 13, wherein the first sidewall comprises an inclined surface.

15. The package structure of claim 13, further comprising a second magnetic field shielding at least partially overlapping with the semiconductor chip from top view perspective.

16. The package structure of claim 13, further comprising a bonding wire connected to the semiconductor chip.

17. The package structure of claim 16, wherein at least a portion of the first sidewall is at a position directly below the bonding wire.

18. The package structure of claim 13, wherein a bottom of the first magnetic field shielding is above the mounting surface.

19. The package structure of claim 13, wherein a bottom of the first magnetic field shielding is attached to the mounting surface by an adhesive layer.

20. The package structure of claim 13, further comprising a molding in direct contact with the first sidewall of the first magnetic field shielding.

* * * * *